US 8,368,577 B2

(12) United States Patent
Aruga et al.

(10) Patent No.: US 8,368,577 B2
(45) Date of Patent: Feb. 5, 2013

(54) A/D CONVERTER

(75) Inventors: Kenta Aruga, Yokohama (JP); Suguru Tachibana, Yokohama (JP); Koji Okada, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 119 days.

(21) Appl. No.: 13/036,429

(22) Filed: Feb. 28, 2011

(65) Prior Publication Data

US 2011/0234433 A1      Sep. 29, 2011

(30) Foreign Application Priority Data

Mar. 24, 2010   (JP) ................................. 2010-068518

(51) Int. Cl.
*H03M 1/10* (2006.01)
(52) U.S. Cl. ......................................... 341/172; 341/150
(58) Field of Classification Search .................. 341/118, 341/120, 150, 161–163, 172
See application file for complete search history.

(56) References Cited

U.S. PATENT DOCUMENTS

| | | | |
|---|---|---|---|
| 4,028,694 A * | 6/1977 | Cook et al. .................... | 341/172 |
| 4,129,863 A | 12/1978 | Gray et al. | |
| 4,200,863 A | 4/1980 | Hodges et al. | |
| 6,429,697 B1 | 8/2002 | Amazeen et al. | |
| 6,683,554 B2 * | 1/2004 | Nikai et al. .................... | 341/161 |
| 6,985,101 B2 | 1/2006 | Leung et al. | |
| 7,928,871 B2 * | 4/2011 | Aruga et al. .................. | 341/172 |
| 2003/0234736 A1 | 12/2003 | Tachibana et al. | |
| 2007/0046519 A1 * | 3/2007 | Hakkarainen et al. ........ | 341/150 |
| 2007/0115159 A1 | 5/2007 | Tachibana et al. | |
| 2010/0001892 A1 | 1/2010 | Aruga et al. | |

FOREIGN PATENT DOCUMENTS

| | | |
|---|---|---|
| JP | 59-083418 A | 5/1984 |
| JP | 06-085562 A | 3/1994 |
| JP | 09-069761 A | 3/1997 |
| JP | 2001-144556 A | 5/2001 |
| JP | 2004-032089 A | 1/2004 |
| JP | 2007-142863 A | 6/2007 |
| JP | 2009-232281 A | 10/2009 |

OTHER PUBLICATIONS

Toshiro Tsukada et al., "High-Accuracy MOS A/D Converter with Inherent Self-Compensation", Electronics and Communications in Japan, 1983, pp. 797-804, vol. J66-C, No. 11.

(Continued)

*Primary Examiner* — Howard Williams
(74) *Attorney, Agent, or Firm* — Arent Fox LLP

(57) ABSTRACT

An A/D converter includes a capacitive DAC configured to perform conversion of high-order bits by receiving a differential signal, a resistive DAC configured to perform conversion of low-order bits, a resistive correction DAC configured to operate to correct the capacitive DAC, and a comparator. The capacitive DAC includes a positive-side capacitive DAC and a negative-side capacitive DAC operating in a complementary fashion, and the comparator, which includes a plurality of differential circuits, is configured to compare output potentials of the positive-side capacitive DAC and the negative-side capacitive DAC. The positive-side capacitive DAC and the negative-side capacitive DAC include first capacitive elements each formed from interconnect layers excluding an uppermost interconnect layer, and the comparator includes second capacitive elements each provided between adjacent ones of the differential circuits and formed from interconnect layers including the uppermost interconnect layer.

15 Claims, 19 Drawing Sheets

OTHER PUBLICATIONS

Toshiro Tsukada et al., "An Automatic Error Cancellation Technique for Higher Accuracy A/D Converters", IEEE J. Solid-State Circuits, Apr. 1984, pp. 266-268, vol. SC-19, No. 2.

Hae-Seung Lee et al., Self-Calibration Technique for A/D Converters, IEEE Transactions on Circuits and Systems, Mar. 1983, pp. 188-190, vol. CAS-30, No. 30.

Hae-Seung Lee et al., "A Self-Calibrating 15 Bit CMOS A/D Converter" IEEE J. Solid-State Circuits, Dec. 1984, pp. 813-819, vol. SC-19, No. 6.

Theodore L. Tewksbury et al., "The Effects of Oxide Traps on the Large-Signal Transient Response of Analog MOS Circuits" IEEE J. Solid-State Circuits, Apr. 1989, pp. 542-544, vol. 24, No. 2.

Ka Y., Leung et al., "A Dual Low Power ½ LSB INL 16B/1Msample/s SAR A/D Converter with on-chip Microcontroller", Asian Solid-State Circuits Conference, 2006, pp. 51-54.

Jiren Yuan et al., "A 10-bit 5-MS/s Successive Approximation ADC Cell Used in a 70-MS/s ADC Array in 1.2-µm CMOS", IEEE J. Solid-State Circuits, Aug. 1994, pp. 866-872, vol. 29, No. 8.

Koichi Sato et al., "A 12 bit 1MHz ADC with 1mW Power Consumption", Technical Report of IEICE, 1994, pp. 9-16, vol. ICD94-46.

Koichi Sato et al., "A 12 bit 1MHz ADC with 1mW Power Consumption", IEEE 1994 Custom Integrated Circuits Conference, 1994, pp. 515-518.

\* cited by examiner

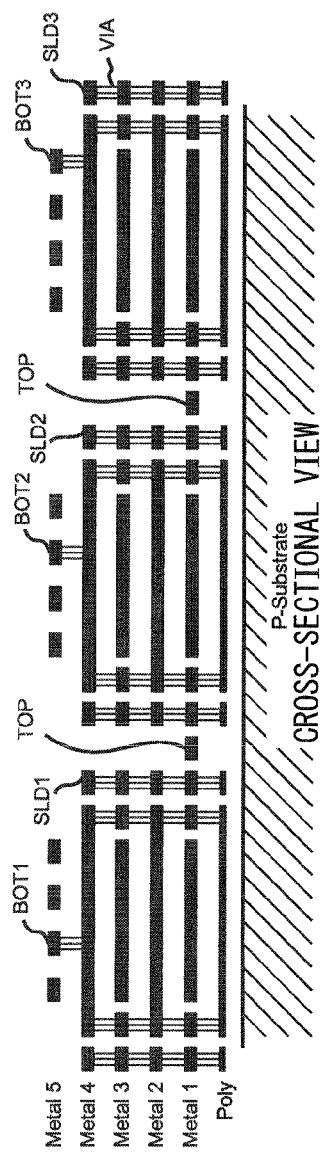
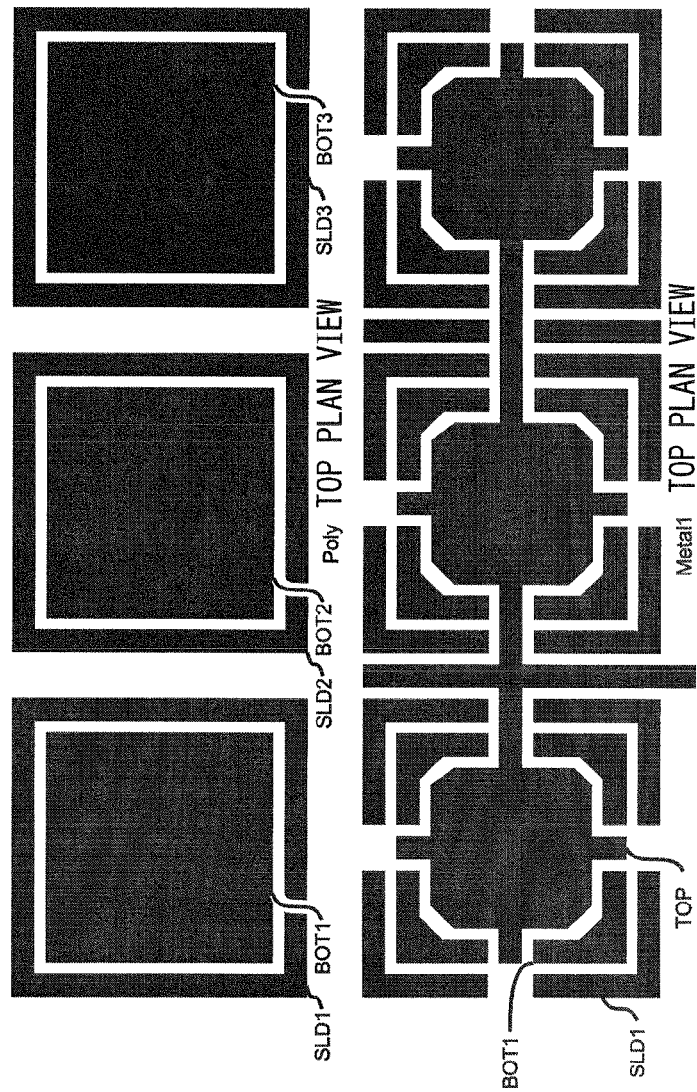
FIG. 10A
FIG. 10B
FIG. 10C

CROSS-SECTIONAL VIEW

Metal5 TOP PLAN VIEW

Metal4 TOP PLAN VIEW

VOLTAGE WAVEFORM OF C10P AND C10N WHEN AMPLITUDE IS NOT LIMITED

VOLTAGE WAVEFORM OF C10P AND C10N WHEN AMPLITUDE IS LIMITED

A/D CONVERTER

CROSS REFERENCE TO RELATED APPLICATION

This application is based upon and claims the benefit of priority of the prior Japanese Patent Application No. 2010-068518, filed on Mar. 24, 2010, the entire contents of which are incorporated herein by reference.

FIELD

The embodiments discussed herein are related to an A/D converter (analog/digital converter: Analog-to-Digital Converter).

BACKGROUND

Successive approximation A/D converters have an extensive range of applications, because they are implemented with relatively simple circuitry, have excellent compatibility with CMOS processes, are manufactured at relatively low cost, and are achieve a relatively fast conversion time. In one specific application, such a successive approximation A/D converter is used, for example, as a built-in A/D conversion circuit in a microcontroller (MCU).

When fabricating a successive approximation A/D converter on a CMOS process semiconductor integrated circuit, it is predominantly implemented using a scheme called "charge redistribution" based on a switched-capacitor technique. The reason is that it is relatively easy to achieve a near ideal switch in a CMOS process.

The successive approximation A/D converter performs A/D conversion by sampling an analog voltage, comparing it with the output voltage of an internal DAC (D/A converter: Digital-to-Analog Converter), and conducting a search until finally obtaining a DAC output where the two voltages match most closely. In a basic successive approximation A/D converter, the search is performed using an algorithm (binary search) that iteratively performs the process for obtaining the midpoint of a section known to contain the answer.

In the case of a charge distribution successive approximation A/D converter fabricated without trimming, the resolution that are achieved is generally 12 bits at the most, due to a mismatch of capacitive elements that occurs during the fabrication. It is known that higher resolutions, for example, resolutions of 14 bits and higher, are be achieved by using self-calibration techniques.

First, of successive approximation A/D converters having a single-ended or differential structure, those having higher resolutions are achieved by using, for example, self-calibration techniques.

In a single-ended A/D converter, the offset of the comparator may not be completely removed due to the effects of switch charge injection. Since the offset error caused by the charge injection only seems to shift the conversion characteristic of the A/D converter in one direction, it may not present a problem in some applications.

However, it is difficult to predict how much charge injection occurs and in what situation, and therefore, there has been the problem that the offset error may become one of circuit uncertainties.

This is a problem that affects the A/D conversion process, but in the case of an A/D converter employing a self-calibration technique, the comparator offset gives rise to another problem when measuring capacitive element errors.

More specifically, since the comparator offset that occurs when measuring the errors acts so as to shift the capacitor mismatch by the amount of the offset, it is not possible to measure the errors accurately. As a result, the self-calibration is not done properly, thus causing a problem that limits the accuracy of the A/D converter.

On the other hand, in the case of an A/D converter having a differential structure, compared with the single-ended A/D converter, the advantage is that the influence of the switch charge injection occurring when ending the sampling in the A/D conversion process may be reduced and, hence, the comparator offset may be reduced.

However, no disclosure is made about the circuit structure that may be employed in order to minimize the comparator offset when measuring the capacitor mismatch in the A/D converter having a self-calibration function. In the self-calibration successive approximation A/D converter, the error caused by the comparator offset presents a greater problem when measuring the capacitor mismatch than when performing the A/D conversion.

Here, to implement a charge distribution A/D converter on a semiconductor chip (integrated circuit), not only the MOS-FETs implementing the logic gate functions but also the capacitive elements used in the capacitive main DAC and the comparator, for example, may be implemented on the integrated circuit.

For example, to achieve a 14-bit or higher resolution A/D converter, the voltage dependence of the capacitive elements forming the capacitive main DAC may be made small enough to achieve the 14-bit resolution, but this employs the use of, for example, PIP capacitors or MIM capacitors.

However, since PIP or MIM capacitors employ additional fabrication steps, etc. for forming these capacitors, the manufacturing cost increases.

In the comparator also, capacitive elements (coupling capacitors) are used for coupling between differential circuits. Here, it becomes preferable to reduce the parasitic capacitance associated with the coupling capacitors; in particular, the parasitic capacitance of the coupling capacitor provided between the first- and second-stage differential circuits may be made sufficiently small. The reason is that, while it is desired for the comparator to sense very small potential differences at high speed, the parasitic capacitance becomes a primary factor that limits the speed.

More specifically, while it is desired to form the coupling capacitors of the comparator, for example, from MIM capacitors having reduced parasitic capacitance and capable of high-speed operation, this employs additional fabrication steps, etc. and increases the manufacturing cost, as described above.

In the related art, various types of A/D converter have been proposed for implementing the successive approximation A/D converter or the charge redistribution successive approximation A/D converter.

Patent Document 1: Japanese Laid-open Patent Publication No. 2009-232281
Patent Document 2: Japanese Laid-open Patent Publication No. S59-083418
Patent Document 3: Japanese Laid-open Patent Publication No. 2004-032089
Patent Document 4: Japanese Laid-open Patent Publication No. 2007-142863
Patent Document 5: U.S. Pat. No. 4,129,863
Patent Document 6: U.S. Pat. No. 4,200,863
Patent Document 7: U.S. Pat. No. 6,985,101
Patent Document 8: Japanese Laid-open Patent Publication No. H06-085562

Patent Document 9: Japanese Laid-open Patent Publication No. H09-069761

Patent Document 10: Japanese Laid-open Patent Publication No. 2001-144556

Non-Patent Document 1: T. Tsukada, K. Takagi, Y. Kita, M. Nagata, "An automatic error cancellation technique for higher accuracy A/D converters", Electronics and Communications in Japan, Scripta Publishing Co., vol. 66, no. 11, 1983

Non-Patent Document 2: T. Tsukada, K. Takagi, Y. Kita, M. Nagata, "An automatic error cancellation technique for higher accuracy A/D converters", IEEE J. Solid-State Circuits, vol. SC-19, no. 2, 1984

Non-Patent Document 3: H. S. Lee, D. A. Hodges, "Self-Calibration technique for A/D converters", IEEE Transactions on Circuits and Systems, Vol. CAS-30, No. 3, March, 1983

Non-Patent Document 4: H. S. Lee, D. A. Hodges, P. R. Gray, "A Self-Calibrating 15 Bit CMOS A/D Converter", IEEE Journal of Solid-State Circuits Vol. SC-19, No. 6, December 1984

Non-Patent Document 5: THEODORE L. TEWKSBURY, HAE-SEUNG LEE, GERALD A. MILLER, "The Effects of Oxide Traps on the Large-Signal Transient Response of Analog MOS Circuits", IEEE Journal of Solid-State Circuits, Vol. 24, No. 2, April 1989

Non-Patent Document 6: Ka Y. Leung, Kafai Leung, Douglas R. Holberg, "A Dual Low Power ½LSB INL 16b/1M-sample/s SAR A/D Converter with on-chip Microcontroller", Asian Solid-State Circuits Conference, Digest of Technical papers, 2006

Non-Patent Document 7: Jiren Yuan, Christer Svensson, "A 10-bit 5-MS/s Successive Approximation ADC Cell Used in a 70-MS/s ADC Array in 1.2 um CMOS", IEEE Journal of Solid-State Circuits, Vol. 29, No. 8, August 1994

Non-Patent Document 8: Kouichi Satou, Kazuhiro Tsuji, Masayuki Sahoda, Tetsuya Iida, "A 12b 1 MHz ADC with 1 mW Power Consumption", Technical Report of IEICE, ICD94-46, pp. 9-16, 1994

Non-Patent Document 9: Kouichi Satou, Kazuhiro Tsuji, Masayuki Sahoda, Hiroshi Otsuka, Kyoko Mori, Tetsuya Iida, "A 12b 1 MHz ADC with 1 mW Power Consumption", IEEE 1994 Custom Integrated Circuits Conference, 1994

SUMMARY

According to an aspect of the embodiments, an A/D converter includes a capacitive DAC, a resistive DAC, a resistive correction DAC, and a comparator. The capacitive DAC includes a positive-side capacitive DAC and a negative-side capacitive DAC operating in a complementary fashion, and is configured to perform conversion of high-order bits by receiving a differential signal.

The resistive DAC is configured to perform conversion of low-order bits, the resistive correction DAC is configured to operate to correct the capacitive DAC, and the comparator, which includes a plurality of differential circuits, is configured to compare output potentials of the positive-side capacitive DAC and the negative-side capacitive DAC.

The positive-side capacitive DAC and the negative-side capacitive DAC include first capacitive elements each formed from interconnect layers excluding an uppermost interconnect layer, and the comparator includes second capacitive elements each provided between adjacent ones of the differential circuits and formed from interconnect layers including the uppermost interconnect layer.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 10A, FIG. 10B and FIG. 10C are diagrams illustrating the structure of first capacitive elements in the A/D converter of FIG. 9;

DESCRIPTION OF EMBODIMENTS

Before describing the embodiments of an A/D converter in detail, a self-calibration successive approximation A/D converter and its associated problems will be described with reference to FIG. 1 to FIG. 8.

Figure 1:
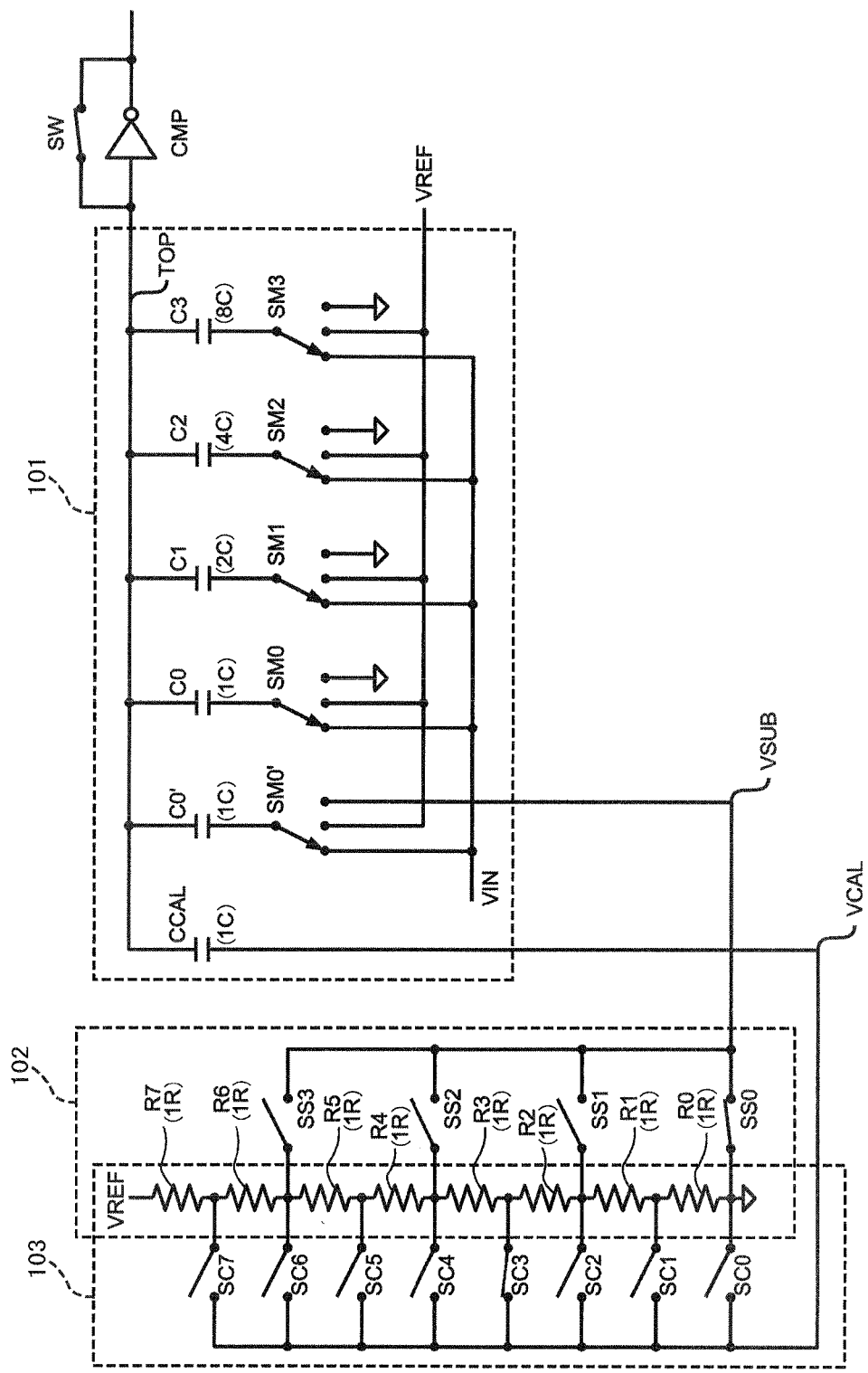
FIG. 1 is a circuit diagram illustrating one example of a self-calibration successive approximation A/D converter.

FIG. 1 is a circuit diagram illustrating one example of the self-calibration successive approximation A/D converter. Self-calibration techniques are usually applied to achieve higher resolutions, for example, 14 bits or higher resolutions, but in FIG. 1, the resolution of the A/D conversion is cut to 6 bits for simplicity of illustration.

In FIG. 1, reference numeral 101 is a capacitive main DAC (capacitive DAC), 102 is a resistive sub-DAC (resistive DAC), and 103 is a correction DAC. On the other hand, reference characters CCAL, C0', C0, C1, C2, and C3 indicate capacitive elements, and designations 1C, 2C, 4C, 8C, etc. attached to the capacitive elements indicate the relative sizes of the respective capacitors.

Reference characters R0, R1, R2, R3, R4, R5, R6, and R7 indicate resistive elements, and designation 1R attached to each resistive element indicates the relative size of the resistive element.

Further, reference characters SM0', SM0, SM1, SM2, SM3, SS0, SS1, SS2, SS3, SC0, SC1, SC2, SC3, SC4, SC5, SC6, and SC7 indicate switches, and VREF denotes a reference voltage.

Reference character VIN designates an analog input voltage, VSUB an output voltage of the sub-DAC, VCAL an output voltage of the correction DAC, TOP a node at the top plate of the capacitor array, SW a switch, and CMP a comparator.

Here, the capacitive elements C0', C0, C1, C2, and C3 and the switches SM0', SM0, SM1, SM2, and SM3 together constitute the capacitive main DAC 101 of four bits. The switches SM0', SM0, SM1, SM2, and SM3 are operable to connect VIN to the bottom plates of the respective capacitive elements, and the 4-bit capacitive main DAC 101 doubles as a sample-and-hold circuit.

The reference voltage is evenly divided across the resistor string (R0 to R7). The switches SS0 to SS3 are connected at intervals of 2R to the resistor string, and this acts as the resistive sub-DAC 102 of two bits and outputs the voltage VSUB.

The output of the resistive sub-DAC 102 is connected to one terminal of the switch SM0' so that the output may be coupled to TOP via the capacitive element C0' of capacitance value 1C. Thus, the capacitive main DAC 101 and the resistive sub-DAC 102 together operate as a 6-bit DAC (D/A converter).

Further, the switches SC0 to SC7 are connected at intervals of 1R to the resistor string (R0 to R7), and this acts as the correction DAC 103 of three bits and outputs the voltage VCAL.

The output voltage VCAL of the correction DAC 103 is applied to TOP via CCAL of capacitance value 1C so that the TOP potential may be controlled independently of the resistive sub-DAC 102. The correction DAC 103 is used to correct the error occurring in the capacitive main DAC due to capacitor mismatch and to measure the capacitor mismatch.

First, the operation of the circuit illustrated in FIG. 1 will be described. To simplify the explanation, it is assumed here that the correction DAC 103 is not operated and VCAL is constantly held at a fixed potential. In the circuit of FIG. 1, sampling is performed to initiate one A/D conversion cycle.

To perform the sampling, the switch SS0 is closed (ON), and SS1, SS2, and S53 are opened (OFF), while on the other hand, SM0', SM0, SM1, SM2, and SM3 are connected to VIN so that VIN is applied to the bottom plates of the capacitive elements C0', C0, C1, C2, and C3.

At the same time, the switch SW is closed to bias the potential at the TOP node to a voltage near the threshold value of the comparator CMP. Then, after a preferable time has elapsed, SW is opened. The TOP node is thus put in a floating state, with its potential held at the threshold voltage of the CMP, and the charge proportional to VIN is stored across C0', C0, C1, C2, and C3 and held unable to escape outside. The above is the operation called sampling.

After the sampling is done, the switch SM3 is connected to VREF, the switches SM2, SM1, and SM0 are connected to ground, and the switch SM0' is connected to VSUB. As a result, the TOP potential either increases or decreases from the threshold voltage of CMP.

Then, it is determined by CMP whether the potential has increased or decreased. If it is determined that the potential has increased, SM3 is connected to ground; on the other hand, if it is determined that the potential has decreased, SM3 is connected to VREF.

Next, the switch SM2 is connected to VREF, and it is determined whether the TOP potential has increased or decreased from the threshold voltage of CMP. If it is determined that the potential has increased, SM2 is connected to ground; on the other hand, if it is determined that the potential has decreased, SM2 is connected to VREF. This process is repeated until the switch SM0 is reached.

Next, the switch SS0 is opened, and the switch SS2 is closed, thus setting VSUB equal to VREF/2. Then, it is determined whether the TOP potential has increased or decreased from the threshold voltage of CMP. If it is determined that the potential has increased, SS2 is opened and SS1 is closed; on the other hand, if it is determined that the potential has decreased, SS2 is opened and SS3 is closed.

When the above process is repeated until the least significant bit is reached, a digital code corresponding to the analog input voltage VIN may be read from the positions of the switches SM3, SM2, SM1, and SM0 and switches SS0, SS1, SS2, and SS3.

More specifically, of the 6-bit digital code, the high-order four bits may be read by seeing whether the switches SM3, SM2, SM1, and SM0 are connected to VREF or to ground. That is, a switch connected to VREF represents "1", and a switch connected to ground represents "0".

Of the 6-bit digital code, the low-order two bits are read as "00" if SS0 is closed, as "01" if SS1 is closed, as "10" if SS2 is closed, and as "11" if SS3 is closed.

The above sequence of switch operations is based on a method called a binary search. The sampled analog signal is compared with the output of DAC, and the DAC input code when the two are closest to each other is searched for by the binary search method, to accomplish the A/D conversion.

The operation of the A/D conversion that does not perform self-calibration has been described above with reference to FIG. 1, but the same description applies to A/D converters having no self-calibration function. It is known that, in such A/D converters, the conversion accuracy is limited primarily due to mismatch in the capacitive main DAC.

It is expected that the capacitive elements forming the capacitive main DAC 101 are binary weighted. However, due to manufacturing errors and layout-induced systematic errors, there may occur discontinuities in the A/D conversion characteristics during the switching of the capacitive main DAC 101. Since the capacitive main DAC 101 is responsible for the conversion of the high-order bits, any mismatch in the capacitive main DAC 101 may have a significant effect on the conversion characteristics.

It is known that, in the case of a non-self-calibration A/D converter implemented on an integrated circuit, the limit of the resolution is around 12 bits. A/D converters having a higher resolution, for example, a 14-bit resolution, are achieved using self-calibration techniques.

In a self-calibration successive approximation A/D converter, a correction DAC having a resolution finer than one LSB of A/D conversion is provided, and the mismatch of the capacitive main DAC is measured in advance by using the correction DAC. Then, the correction DAC is operated so as to cancel out the error occurring in the capacitive main DAC during the A/D conversion, thereby improving the A/D conversion characteristics. In FIG. 1, the correction DAC 103 is constructed from the switches SC0 to SC7, and the correction DAC 103 produces the output VCAL.

In the case of FIG. 1, the resistive sub-DAC 102 and the resistive correction DAC 103 are connected to TOP via a single coupling capacitor, but a plurality of coupling capacitors may be used here.

According to the method that uses a plurality of coupling capacitors, since the time constant of the output node of the resistive DAC may be reduced, the resistive DAC may be operated at higher speed, and as a result, faster A/D conversion may be achieved. This method also offers the effect of reducing the area, since the number of switches in the resistive DAC may be reduced. In the circuit of FIG. 1, this effect may be applied to both the resistive sub-DAC 102 and the resistive correction DAC 103.

Figure 2:
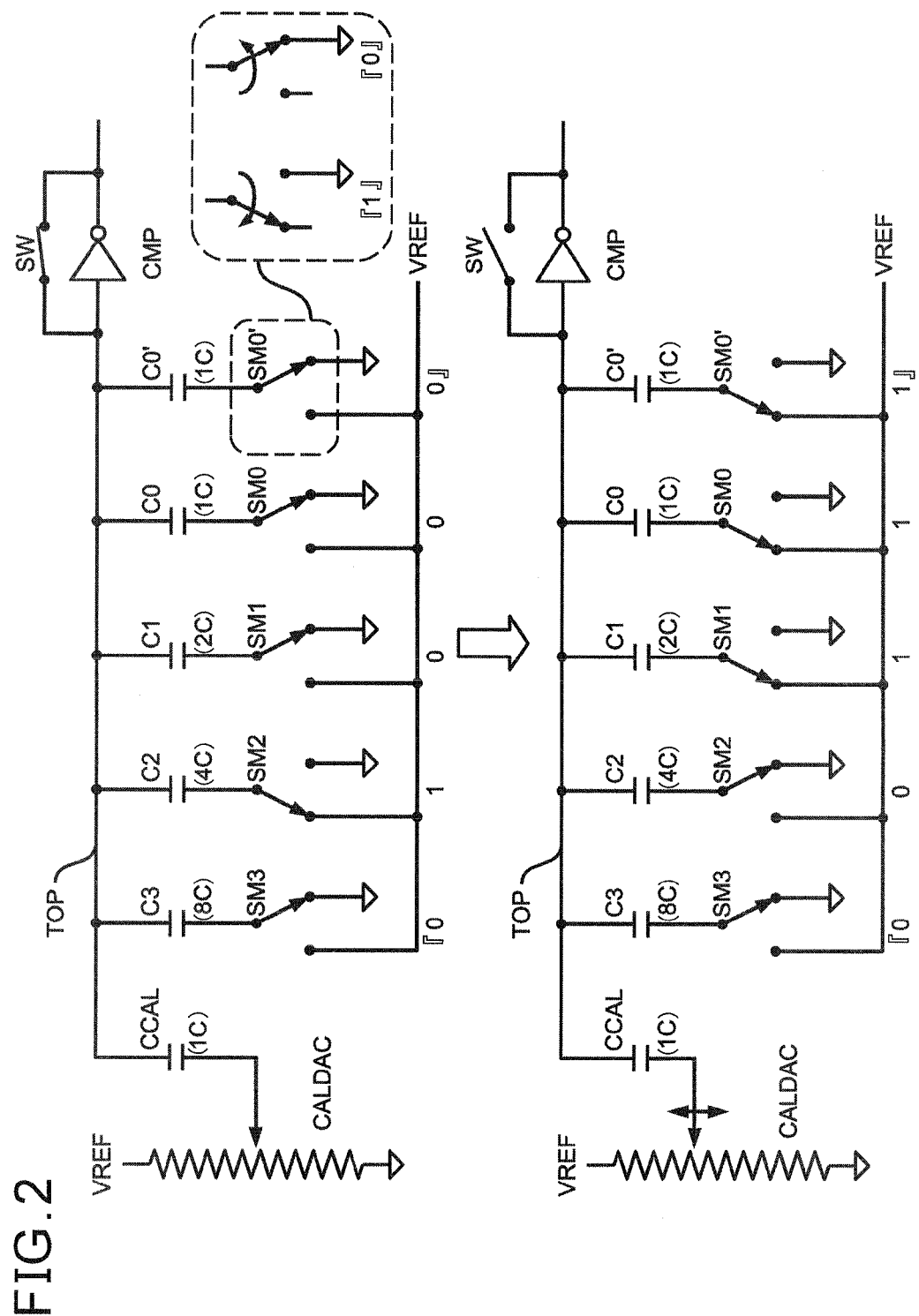
FIG. 2 is a diagram for explaining a sequence of capacitor error measurement.

The self-calibration successive approximation A/D converter employs that the capacitor mismatch be measured in advance (error measurement). FIG. 2 is a diagram for explaining a sequence of capacitor error measurement.

In FIG. 2, reference characters CCAL, C0', C0, C1, C2, and C3 indicate the capacitive elements, and designations 1C, 2C, 4C, 8C, etc. attached to the capacitive elements indicate the relative sizes of the respective capacitors.

Further, reference character VREF indicates the reference voltage, TOP the node at the top plate of the capacitor array, SW the switch, CMP the comparator, and CALDAC the correction DAC.

On the other hand, reference characters SM0', SM0, SM1, SM2, and SM3 indicate the switches. Each of these switches represents "0" when connected to ground, and "1" when connected to VREF.

The capacitor mismatch is measured by measuring the difference in capacitance between a pair of capacitors to be matched. FIG. 2 illustrates the case where the capacitor mismatch is measured by comparing C2 and (C1+C0+C0'). The capacitance of the capacitive element C2 is 4C, and it is expected that the total capacitance of the capacitive elements C1, C0, and C0' becomes equal to 4C. In actuality, however, an error occurs due to manufacturing variations, etc., and this error is measured here.

First, the switches SM3, SM2, SM1, SM0, and SM0' at the bottom plates of the respective capacitive elements are set to "01000", and the switch SW is closed (see diagram in the upper part of FIG. 2). The TOP node is thus biased to the threshold value of the comparator CMP.

Next, the switch SW is opened, and the switches at the bottom plates of the respective capacitive elements are set to "00111" (see diagram in the lower part of FIG. 2). As a result, a potential difference proportional to the difference between C2 and (C1+C0+C0') appears at the TOP node. The comparator CMP outputs a "0" if this potential change is positive, and a "1" if it is negative.

The CALDAC (correction DAC) is operated so as to minimize the potential change in accordance with the result of the decision made by the comparator. The finally obtained CALDAC control code provides an error value. The above process is repeated for each pair of capacitors to be matched.

When performing the A/D conversion, the capacitive DAC is corrected by using the thus obtained error value. With the self-calibration technique described above, manufacturing variations of the capacitive DAC may be canceled out, and an A/D converter having a resolution of 14 bits or higher may be achieved.

By implementing the A/D converter in a differential input configuration, rather than a single-ended configuration, the accuracy may be enhanced in certain cases. For example, if a sensor is incorporated in a resistance bridge circuit, since the potential difference between any two contacts may be directly measured in the case of a differential-input A/D converter, the measurement may be made with high accuracy. Compared with the single-ended case, a further advantage of the differential A/D converter is that it provides enhanced immunity to common mode noise. Generally, a differential A/D converter not only has a differential input, but its internal structure is also implemented in a differential configuration.

Figure 3:
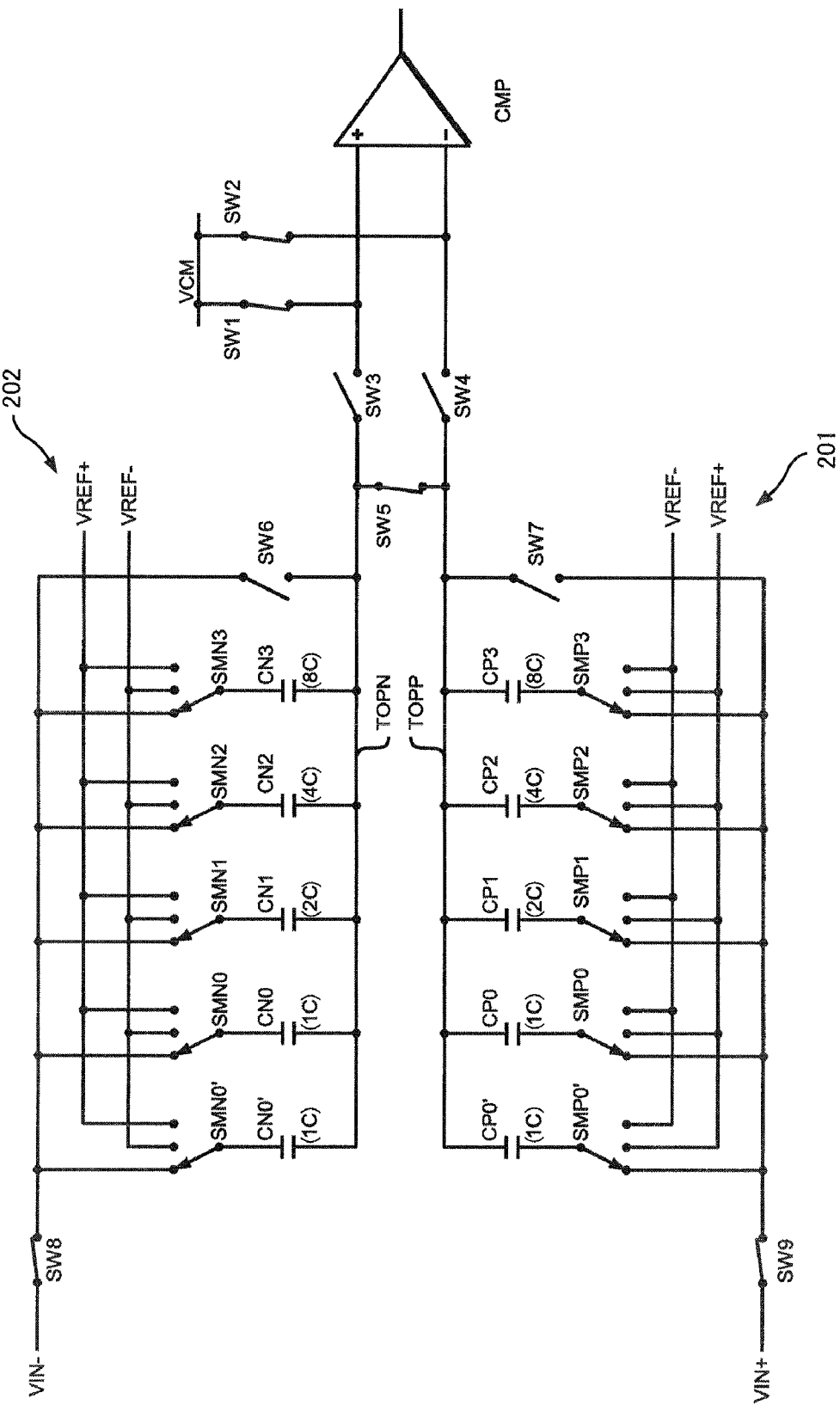
FIG. 3 is a circuit diagram illustrating one example of a differential A/D converter.

FIG. 3 is a circuit diagram illustrating one example of the differential A/D converter. In FIG. 3, the resolution of the A/D conversion is cut to 4 bits for simplicity of illustration.

In FIG. 3, reference numeral 201 is a positive-side digital/analog converter (positive-side DAC), and 202 is a negative-side digital/analog converter (negative-side DAC). On the other hand, reference characters CN0', CN0, CN1, CN2, CN3, CP0', CP0, CP1, CP2, and CP3 indicate capacitive elements, and designations 1C, 2C, 4C, 8C, etc. attached to the capacitive elements indicate the relative sizes of the respective capacitors.

Reference characters SMN0', SMN0, SMN1, SMN2, SMN3, SMP0', SMP0, SMP1, SMP2, SMP3, SW1, SW2, SW3, SW4, SW5, SW5, SW6, SW7, SW8, and SW9 indicate switches.

Further, reference character VREF+ indicates a positive-side reference voltage, VREF− a negative-side reference voltage, VIN+ a positive-side analog input voltage, VIN− a negative-side analog input voltage, and CMP a comparator.

As illustrated in FIG. 3, the differential A/D converter includes the positive-side DAC 201 and the negative-side DAC 202. The positive-side DAC 201 includes the capacitive elements CP0 to CP3 and the switches SMP0' to SMP3, while the negative-side DAC includes the capacitive elements CN0' to CN3 and the switches SMN0' to SMN3.

One A/D conversion operation of the differential A/D converter will be described with reference to FIG. 3. In FIG. 3, the resolution of the A/D conversion is simplified to 4 bits, and the capacitive DAC is constructed to convert all the four bits.

In the circuit of FIG. 3, before to sampling, the sampling capacitors are discharged to reduce the charges stored on the sampling capacitors to zero. That is, to discharge the capacitors, the switches SW8 and SW9 are opened, SW5 is closed, SW3 and SW4 are opened, and SW1 and SW2 are closed.

Further, the switches SMP0', SMP0, SMP1, SMP2, and SMP3 are connected to VIN+, the switches SMN0', SMN0, SMN1, SMN2, and SMN3 are connected to VIN−, and SW6 and SW7 are closed.

With the above operation, the two terminals of each of the capacitive elements CP0', CP0, CP1, CP2, CP3, CN0', CN0, CN1, CN2, and CN3 are short-circuited, and all the charges stored on these capacitors are discharged.

Next, sampling is performed. After the discharge is done, SW6 and SW7 are opened, and SW8 and SW9 are closed. As a result, VIN+ is applied to one node of each of the capacitive elements CP0', CP0, CP1, CP2, and CP3, and VIN− is applied to one node of each of the capacitive elements CN0', CN0, CN1, CN2, and CN3.

At this time, the TOPN and TOPP nodes settle at a potential of $\{(VIN+)-(VIN-)\}/2$. After a certain time has elapsed, SW5 is opened, and shortly after that, SW8 and SW9 are opened. As a result, the TOPN and TOPP nodes are put in a floating state, and a charge proportional to the potential difference {(VIN+)−(VIN−)} is stored on each capacitive element.

After the sampling is done, SW1 and SW2 are opened, and SW3 and SW4 are closed. Further, to perform successive conversion, in the positive-side DAC 201, SMP3 is thrown to the VREF+ side and SMP2, SMP1, SMP0, and SMP0' are thrown to the VREF− side. On the other hand, in the negative-side DAC 202, SMN3 is thrown to the VREF− side and SMN2, SMN1, SMN0, and SMN0' are thrown to the VREF+ side.

As a result, a potential difference occurs between TOPP and TOPN, and the most significant bit of the output digital code is determined according to the decision made by the comparator CMP as to whether the potential difference is positive or negative. Then, as in the single-ended case, bit decisions are successively made on the bits of the output digital code in decreasing order of their significance.

Here, the switches SMP0' and SMN0', SMP0 and SMN0, SMP1 and SMN1, SMP2 and SMN2, and SMP3 and SMN3, respectively, operate in a complementary fashion, and the finally decided switch states represent the result of the A/D conversion.

In the circuit of FIG. 3, the capacitive main DAC (201, 202) is responsible for all the 4-bit conversion resolution, but the conversion of lower-order bits may be allocated, for example, to a resistive DAC (resistive sub-DAC), as in the case of the single-ended case of FIG. 1. By thus making provisions to use a resistive DAC for the conversion of lower-order bits, the A/D converter may be implemented in a smaller area than the case where the conversion of all the bits is performed by using the capacitive DAC alone.

Here, when allocating the conversion of lower-order bits to the resistive DAC, a method may be employed that divides the resistive DAC to produce a plurality of outputs and that couples them to the capacitive main DAC by using a plurality of coupling capacitors. When the resistive DAC is thus divided, the number of switches may be reduced, which serves to reduce parasitic capacitance and to achieve faster A/D conversion. Furthermore, the used silicon area may be reduced because of the reduced number of used switches. This effect is the same as that achieved with the earlier described single-ended A/D converter.

The above has described the single-ended A/D conversion circuit and also described the self-calibration technique used to achieve a higher resolution A/D converter; further, the differential A/D conversion circuit has also been described.

Next, a description will be given of the comparator CMP used in the above A/D converters. The comparator CMP is used to compare the sampled analog voltage with the output voltage of the internal DAC and to decide which is greater. If the time taken to make this decision may be shortened, the speed of the A/D conversion may be correspondingly increased.

Here, the conversion speed of the A/D converter is also related to its resolution. As the resolution increases, the potential difference on which a decision is to be made becomes smaller. For example, if the resolution increases by two bits, the potential difference on which a decision is to be made becomes smaller by a factor of four, and as a result, the time taken to make the decision increases.

Figure 4:
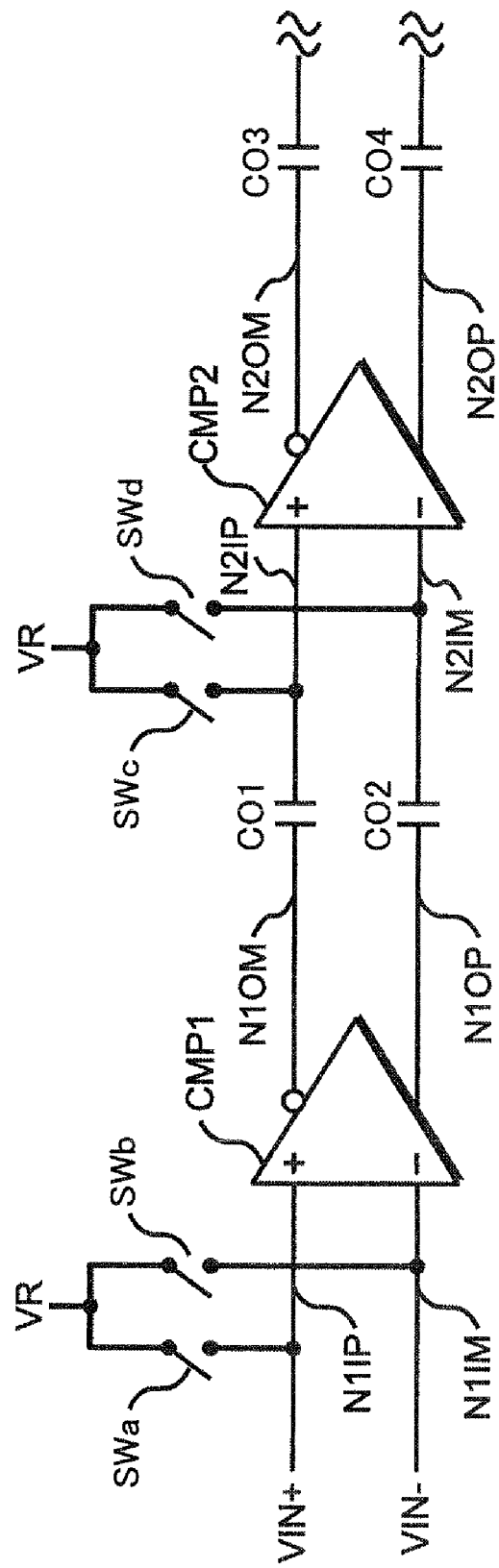
FIG. 4 is a circuit diagram illustrating one example of a comparator.

FIG. 4 is a circuit diagram illustrating one example of the comparator circuit. The circuit of FIG. 4 has the function of comparing VIN+ and VIN− while canceling the offsets of differential circuits CMP1 and CMP2.

In FIG. 4, reference characters CMP1 and CMP2 denote the differential circuits constituting the comparator CMP, and SWa, SWb, SWc, and SWd indicate switches, while C01, C02, C03, and C04 indicate capacitive elements.

Reference character N1IP indicates a positive-side input node of the first-stage differential circuit, N1IM a negative-side input node of the first-stage differential circuit, N1OP a positive-side output node of the first-stage differential circuit, and N1OM a negative-side output node of the first-stage differential circuit.

Further, reference character N2IP indicates a positive-side input node of the second-stage differential circuit, N2IM a negative-side input node of the second-stage differential circuit, N2OP a positive-side output node of the second-stage differential circuit, and N2OM a negative-side output node of the second-stage differential circuit.

Reference character VIN+ indicates a voltage to be applied to the positive-side input node of the first-stage comparator, VIN− a voltage to be applied to the negative-side input node of the first-stage comparator, and VR a voltage near the midpoint of the supply voltage.

First, before commencing the comparison, the switches SWa, SWb, SWc, and SWd are closed. With this operation, the output offset of the differential circuit CMP1 is applied to the capacitors C01 and C02, and the output offset of CMP2 is applied to the capacitors C03 and C04.

Next, all the switches SWa to SWd are opened, thus putting the nodes N1IP, N1IM, N2IP, and N2IM in a floating state; as a result, the output offset of CMP1 are stored on C01 and C02, and the output offset of CMP2 are stored on C03 and C04.

With the offsets thus stored, if a potential difference occurs between VIN+ and VIN−, the potential difference is multiplied by the gain of CMP1 and appears at N1OM and N1OP. This is further multiplied by the gain of CMP2 and appears as a potential difference between N2OM and N2OP.

Here, since the offset voltages of CMP1 and CMP2 are held stored on C1 to C4, respectively, the threshold value for comparison is unaffected. The circuit diagram of FIG. 4 is a simplified one and depicts only two stages of differential circuits, but in practice, as many stages as preferable to obtain the gain preferable for the A/D conversion are provided.

Figure 5:
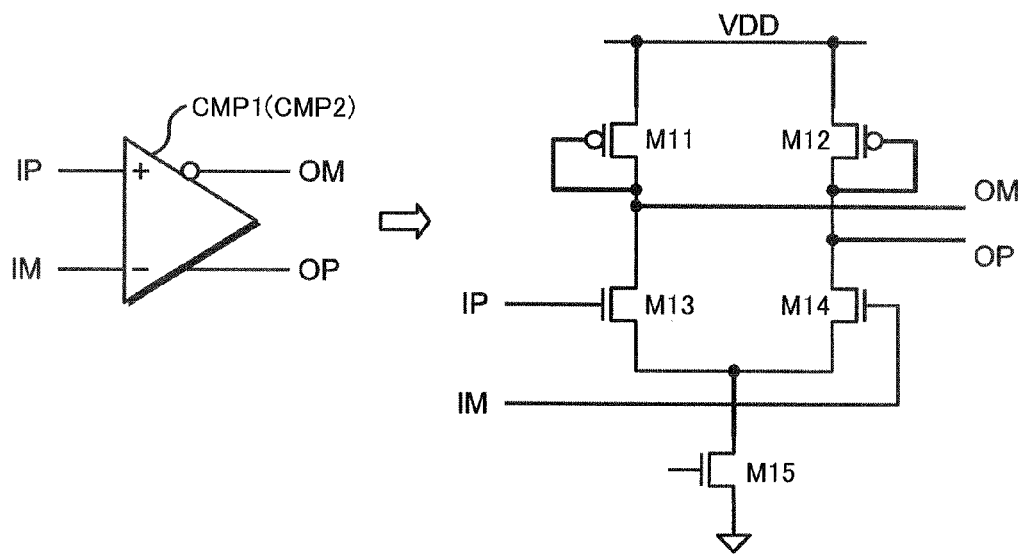
FIG. 5 is a circuit diagram illustrating one example of a differential circuit in the comparator of FIG. 4.
Figure 6:
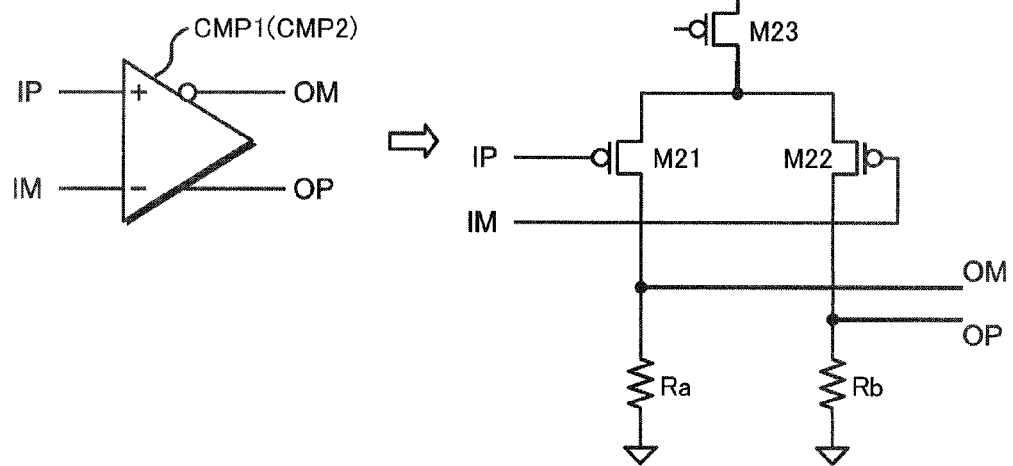
FIG. 6 is a circuit diagram illustrating another example of the differential circuit in the comparator of FIG. 4.

While the differential circuits CMP1 and CMP2 are depicted in a simplified block form in FIG. 4, the differential circuits may each be implemented, for example, by a transistor-level circuit as illustrated in FIG. 5 or 6.

FIG. 5 is a circuit diagram illustrating one example of the differential circuit CMP1 (CMP2) in the comparator of FIG. 4. In FIG. 5, reference character IP indicates the positive-side input node of the differential circuit, IM the negative-side input node of the differential circuit, OP the positive-side output node of the differential circuit, OM the negative-side output node of the differential circuit, and VDD a node for supplying the supply voltage.

Further, reference characters M11 and M12 are p-channel MOS transistors (pMOS transistors), and M13, M14, and M15 are n-channel MOS transistors (nMOS transistors).

In the differential circuit of FIG. 5, the pair of nMOS transistors M13 and M14 forms the input differential pair, and the diode-connected pMOS transistors M11 and M12 act as the loads. The nMOS transistor M15 acts to supply a bias current.

The nMOS transistors M13 and M14, whose sources are connected together, act to share the bias current between them according to the potential difference between IP and IM. On the other hand, the diode-connected pMOS transistors M11 and M12 each act as a load like a resistor.

It is known that, in an nMOS transistor, a phenomenon called charge-trapping occurs, that is, a channel charge is trapped at the oxide film, causing the threshold voltage to change. The effect of this is that the threshold value varies due to a transient voltage applied between gate and source, seemingly providing a hysteresis characteristic. It is also known that the effect (influence) of this phenomenon that causes the threshold voltage to change is smaller in the case of a pMOS transistor than in the case of an nMOS transistor.

In the differential circuit CMP1 (CMP2) of FIG. 5, the variation of the threshold value causes a variation in the threshold voltage of the nMOS differential pair, and manifests itself as a change in the threshold voltage of the comparator CMP.

Further, in the successive approximation process of the A/D conversion, since a relatively large stress is applied to the nMOS differential pair, the threshold value of the comparator may change, depending on the bit being compared, and an error may occur in the result of the A/D conversion. Such a phenomenon may be mitigated by constructing the circuit by inverting the pMOS transistors and nMOS transistors in FIG. 5.

FIG. 6 is a circuit diagram illustrating another example of the differential circuit CMP1 (CMP2) in the comparator of FIG. 4. In the circuit of FIG. 5, the diode-connected pMOS transistors M11 and M12 have been used as the loads, but in the circuit of FIG. 6, resistors Ra and Rb are used as the loads.

In FIG. 6, reference character IP indicates the positive-side input node of the differential circuit, IM the negative-side input node of the differential circuit, OP the positive-side output node of the differential circuit, OM the negative-side output node of the differential circuit, and VDD a node for supplying the supply voltage. Further, reference characters M21, M22, and M23 are pMOS transistors, and Ra and Rb are the resistors.

That is, the differential circuit illustrated in FIG. 6 may be regarded as a circuit constructed by interchanging the pMOS transistors and nMOS transistors in the differential circuit of FIG. 5 and by forming the loads from the resistors. In the circuit of FIG. 6, since the differential pair is constructed from pMOS transistors, the possibility of the threshold value varying under application of a stress is small. Further, if devices having a structure that may reduce parasitic capacitance are selected for use as the resistors Ra and Rb that act as the loads, it may become possible to enhance the speed compared with the circuit of FIG. 5.

Figure 7:
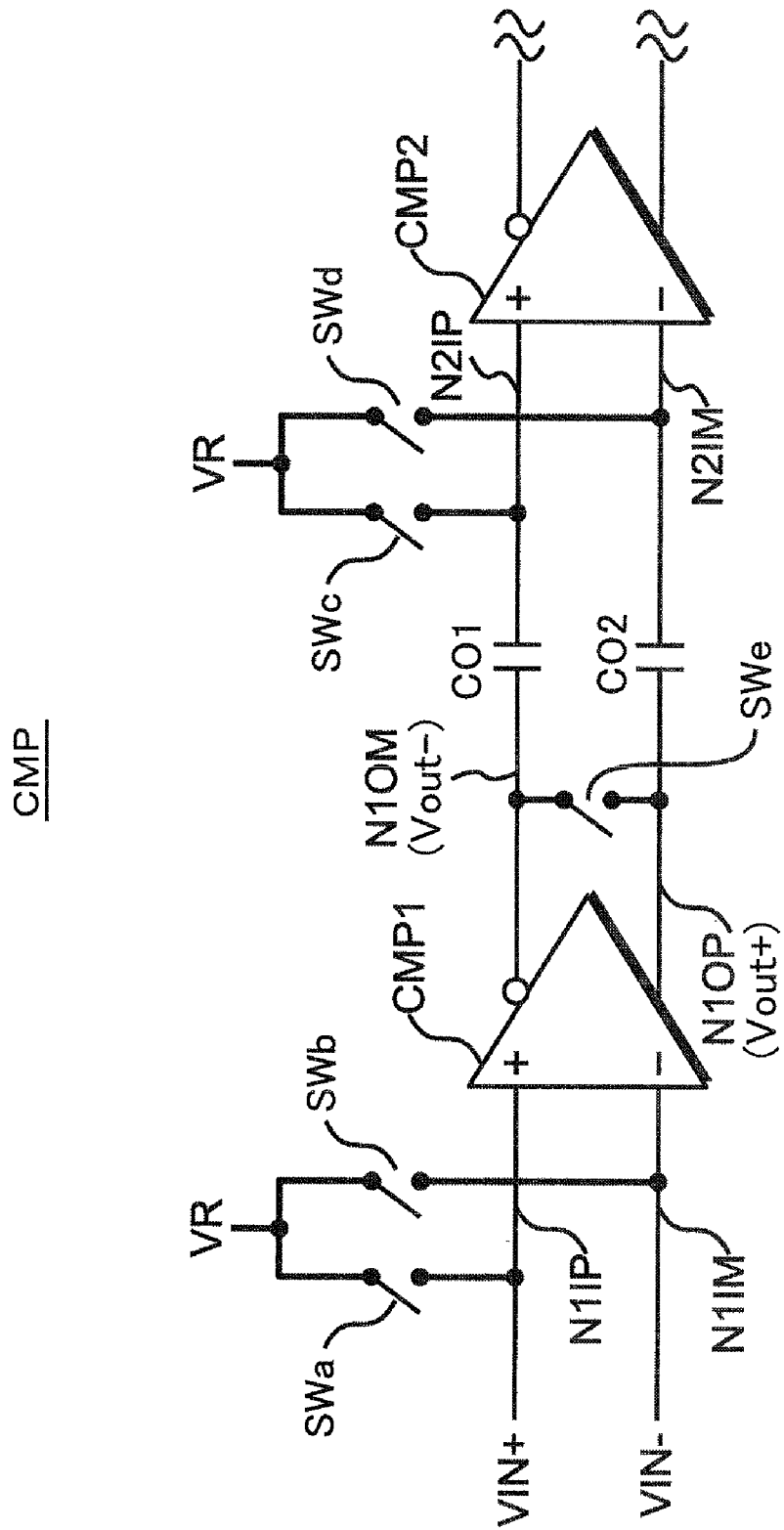
FIG. 7 is a circuit diagram illustrating another example of the comparator.
Figure 8:
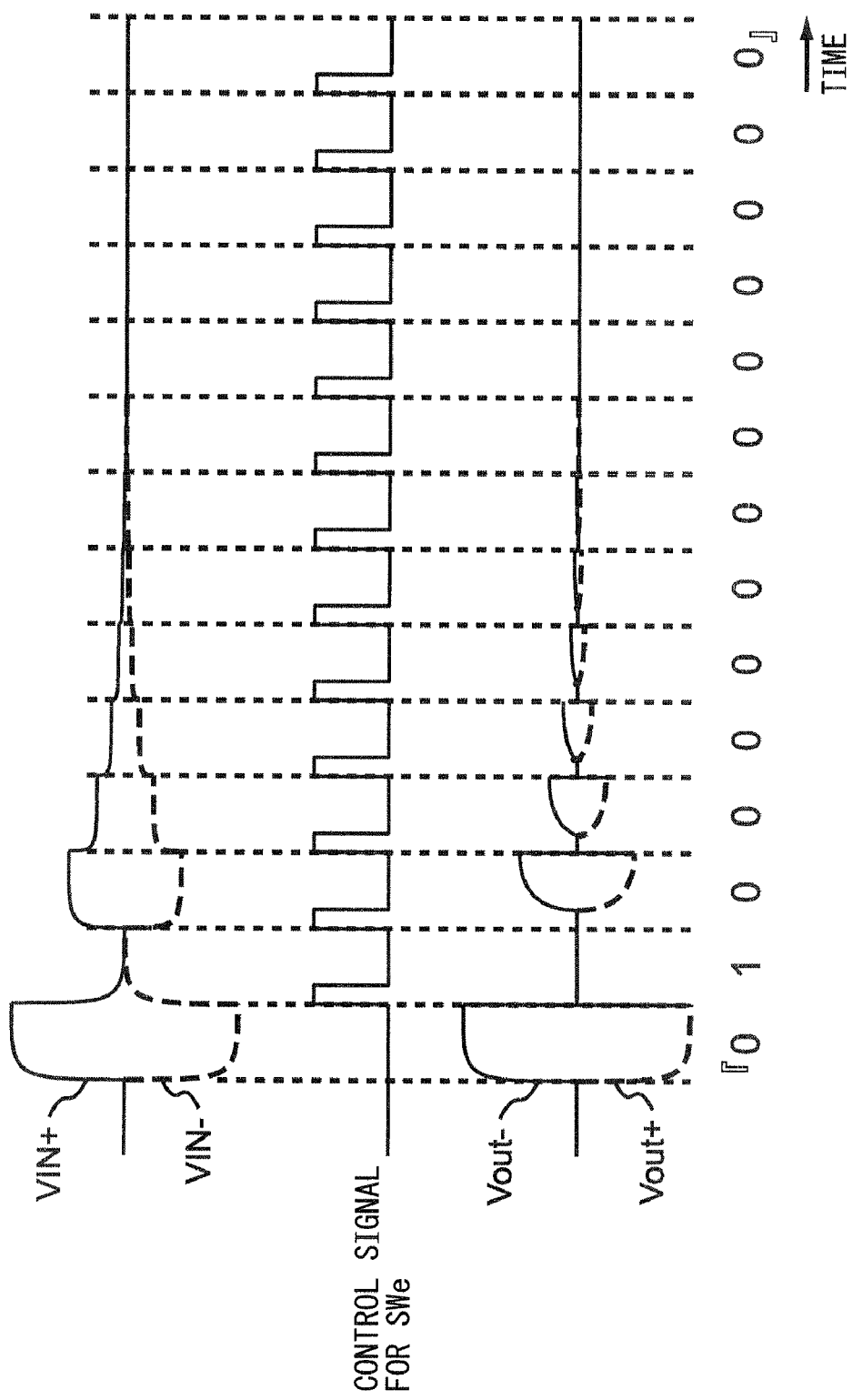
FIG. 8 is a diagram for explaining the operation of the comparator of FIG. 7.

Another known example of the differential circuit that enhances the speed of the comparator CMP is one that uses an equalizing switch. FIG. 7 is a circuit diagram illustrating another example of the comparator, and FIG. 8 is a diagram for explaining the operation of the comparator of FIG. 7.

In FIG. 7, reference characters CMP1 and CMP2 denote the differential circuits constituting the comparator CMP, and SWa, SWb, SWc, SWd, and SWe indicate switches, while C01 and C02 indicate capacitive elements. Here, the switch SWe functions as a switch for equalizing.

Reference character N1IP indicates the positive-side input node of the first-stage differential circuit, N1IM the negative-side input node of the first-stage differential circuit, N1OP the positive-side output node of the first-stage differential circuit, and N1OM the negative-side output node of the first-stage differential circuit.

Further, reference character N2IP indicates the positive-side input node of the second-stage differential circuit, N2IM the negative-side input node of the second-stage differential circuit, N2OP the positive-side output node of the second-stage differential circuit, and N2OM the negative-side output node of the second-stage differential circuit.

Reference character VIN+ indicates the potential at the positive-side input node of the differential circuit CMP1, and VIN− the potential at the negative-side input node of the differential circuit CMP1, while Vout+ indicates the potential at the positive-side output node of the differential circuit CMP1, and Vout− the potential at the negative-side output node of the differential circuit CMP1.

Here, when attention is paid to the comparison period of a given bit in the successive approximation process of the A/D conversion, it is seen that the potential difference between Vout+ and Vout− is large in the early part of the comparison period as that part immediately follows the end of the comparison period of the higher order bit.

If the decision is made by taking the large difference between Vout+ and Vout− as the initial value of the comparison period, it will take time to complete the decision, thus slowing the operation. It is therefore effective to close the switch SWe at the beginning of the comparison period and thereby cause the potential difference between Vout+ and Vout− to quickly decrease.

FIG. 8 illustrates the waveform of the input voltage (VIN+, VIN−) to the differential circuit CMP1, the waveform of the signal for controlling the switch SWe, and the waveform of the output voltage (Vout+, Vout−) of the differential circuit CMP1. FIG. 8 illustrates the case where decisions are made on 14 bits of "01000000000000" as one example of the A/D conversion.

As illustrated in FIG. 7 and FIG. 8, the potential difference between Vout+ and Vout− is reduced to zero at the beginning of the comparison period by the action of SWe. Therefore, after SWe is opened, it is only preferable to compare the input potentials from the state in which the initial value is 0; as a result, the comparison (decision) operation ends in a shorter time than when SWe is not provided.

As described above, it has been proposed in the related art to use an equalizing switch in order to reduce the time used for the comparator to complete the comparison and thereby enhance the speed of A/D conversion.

The background art has been described above from the standpoint of circuit techniques for achieving high-resolution A/D converters. Next, a description will be given of the capacitive elements used to implement the circuit.

Capacitive elements used in semiconductor integrated circuits may be classified into several types according to their structure. These include, for example, MOS capacitors, poly-diffusion capacitors, PIP (Poly Insulator Poly) capacitors, and MIM (Metal Insulator Metal) capacitors.

The MOS capacitor may be a MOS transistor used as a capacitive element, the structure being such that the gate is used as the top electrode and the bottom electrode is provided by the channel region and the source/drain region. Since the MOS capacitor may be formed by the same process for forming a MOS transistor, any MOS process may be used.

However, the MOS capacitor has the disadvantage that, since the impurity concentration in the bottom plate is low, the potential profile in the channel region tends to change with the applied voltage, that is, the voltage dependence of the capacitor is large.

To improve the voltage dependence of the MOS capacitor, the capacitor may be formed by increasing the impurity concentration in the bottom plate. This capacitor also has a MOS (Metal Oxide Semiconductor) structure, but in this specification, this capacitor is called the poly-diffusion capacitor to distinguish it from the above-described MOS capacitor. The poly-diffusion capacitor is so named because a polysilicon layer is used as the top electrode and a diffusion layer as the bottom plate.

Compared with the MOS capacitor, the poly-diffusion capacitor has an improved voltage dependence and, in a typical fabrication process, the first-order voltage coefficient of the capacitor is about 0.5% [1/V], an improvement over the MOS capacitor. However, the voltage coefficient of the poly-diffusion capacitor is still relatively large and may become a problem in certain applications.

More specifically, if the capacitive main DAC in the A/D converter is formed using, for example, MOS capacitors or poly-diffusion capacitors, the conversion characteristics become nonlinear because of the high voltage coefficient. This effect becomes more pronounced particularly in the case of high-resolution A/D converters. In the case of the capacitive main DAC used in a single-ended A/D converter, the voltage dependence curve of the capacitor directly indicates up as the transfer characteristic of the A/D conversion.

On the other hand, in the case of a differential A/D converter, the first-order voltage coefficient may be canceled out by constructing the circuit so that, at the time of sampling, voltages equal in magnitude are applied to the positive-side DAC and the negative-side DAC. However, since the effects of the second- and higher-order coefficients still illustrate up in the transfer characteristic, the poly-diffusion capacitor may not be used in a high-resolution A/D converter.

Moreover, in the MOS and poly-diffusion capacitors, relatively large parasitic capacitance occurs because of the presence of a p-n junction in the bottom electrode.

Further, the fabrication of the poly-diffusion capacitor employs an additional mask and fabrication step for injecting impurities into the region under the gate. This is because, in a generally practiced silicon gate process, the polysilicon layer is formed before implanting or diffusing ions into the source/drain regions.

The PIP capacitor refers to a capacitor in which the top and bottom electrodes are each formed from a polysilicon layer. Since the electrodes of the PIP capacitor are not ideal conductors but highly doped semiconductors, if a potential difference occurs between the terminals, the surface potential of each electrode changes.

In the PIP capacitor, since the impurity concentration in the electrode is relatively high, the surface potential change is small and the voltage dependence is also very small. For example, in a typical fabrication process, the first-order voltage coefficient is about 0.005% [1/V] which is negligible in most applications.

However, the interlayer film between the silicon substrate and the bottom electrode of the PIP capacitor is relatively thin, and the parasitic capacitance to ground of the bottom plate is large. In the PIP capacitor, the proportion of the parasitic capacitance is relatively large, though it is small compared with the MOS capacitor or the poly-diffusion capacitor.

The MIM capacitor refers to a capacitor in which a metal such as aluminum or copper is used to form the top and bottom electrodes. Since the electrodes are metal, the MIM capacitor has the advantage that the voltage dependence is smaller than that of the PIP capacitor. Further, the capacitance to ground of the bottom electrode is generally smaller than that of the PIP electrode.

Thus, it is generally known that capacitive elements such as described above may be formed on semiconductor integrated circuits and, when fabricating an A/D converter, the device structure of the capacitive elements is suitably chosen according to the resolution or speed.

As described above with reference to FIG. 1 and FIG. 2, a high resolution single-ended A/C converter is implemented, for example, by using a self-calibration technique. On the other hand, for a differential A/D converter, the circuit illustrated in FIG. 3, for example, is known and is implemented in practice. Further, as described with reference to FIG. 4 to FIG. 8, various types of comparator are applicable for use as the comparator in the A/D converter.

However, the single-ended A/C converter described above has the problem that the offset of the comparator may not be completely removed. This will be explained in connection with the related art self-calibration successive approximation A/D converter illustrated in FIG. 1.

As earlier described, in the single-ended A/C converter of FIG. 1, the switch SW may be opened (OFF) to end the sampling. This switch SW is implemented using a MOS transistor, but the problem is that when the MOS transistor is switched off, charge injection occurs on the TOP node, causing the TOP potential to shift from the threshold value of CMP, and hence the offset of the comparator CMP.

Here, the offset voltage caused by the charge injection has little effect on the accuracy if it is sufficiently smaller than the minimum resolution of the A/D converter. However, in the case of a high-resolution A/D converter, the error caused by the offset voltage becomes pronounced.

Since the error caused by the offset voltage only seems to shift the conversion characteristic of the A/D converter in one direction, it may not present a problem in some applications. However, it is difficult to predict how much charge injection occurs and in what situation, and this may become one of circuit uncertainties.

As described above, the single-ended successive approximation A/D converter has the problem that some of the offset remains unremoved in the comparator. This is a problem that affects the A/D conversion process. However, in the case of an A/D converter employing a self-calibration technique, the offset remaining in the comparator may cause a serious problem when measuring capacitive element errors.

The sequence of capacitor error measurement according to the self-calibration technique described with reference to FIG. 2 concerns an example of measuring an error occurring between the pair of capacitors C2 and (C1+C0+C0'); in this sequence, first the capacitive main DAC is set to "01000", and SW is closed. With this switch closure, the TOP potential is biased to the threshold value of CMP.

Next, SW is opened, and the capacitive main DAC is set to "00111". As a result, a potential change proportional to the degree of matching between C2 and (C1+C2+C0+C0') occurs at the TOP node, and the amount of this potential change is measured by CALDAC.

However, in the method described with reference to FIG. 2, charge injection occurs from the switch SW onto the TOP node the instant that SW is opened. With this phenomenon, the TOP potential, which may normally provide the threshold value of CMP, becomes displaced, and this offset remains as the offset of CMP.

If the offset remains in the comparator in this way, the capacitor mismatch is shifted by the amount of the offset, resulting in an inability to measure the error accurately. As a result, the error correction of the A/D conversion is not done properly, and the accuracy of the A/D converter is thus limited.

One approach to avoiding the problem of the residual offset of the comparator is to employ a differential capacitive main DAC and differential comparator. The differential A/D converter described with reference to FIG. 3 has the advantage that the influence of the residual offset due to the switch charge injection is small compared with the single-ended type illustrated in FIG. 1.

The reason is that it may be expected that when opening SW5 to end the sampling, the amount of charge to be injected from SW5 is substantially the same between TOPN and TOPP, and as a result, the direction of the potential change caused by the injection also becomes the same.

Further, when opening SW1 and SW2, charge injection also occurs on the input nodes of the comparator, but if SW1 and SW2 are made identical in shape, the amount of charge injection on the positive-side input node of the comparator becomes substantially the same as the amount of charge injection to the negative-side input node, and as a result, the direction of the potential change caused by the injection also becomes the same.

Similarly, when closing SW3 and SW4, charge injection also occurs, but if these switches are designed so as to be identical in shape, the amount of charge injection may be made substantially the same between the positive side and the negative side. In the differential A/D converter, since the potential difference between the positive-side input and the negative-side input is compared by the comparator CMP, if the same potential change occurs on the positive-side and negative-side nodes due to the charge injection, the resulting effect may be canceled out.

The differential A/D converter described with reference to FIG. 3 has the advantage that the influence of the switch charge injection occurring when ending the sample in the A/D conversion process may be reduced compared with the single-ended A/D converter illustrated in FIG. 1.

It is known that the comparator offset occurring during the A/D conversion may be removed by employing the differential structure such as illustrated in FIG. 3. However, no disclosure is made about the circuit structure that may be employed in order to minimize the comparator offset when measuring the capacitor mismatch.

As previously described, in the self-calibration successive approximation A/D converter, the error caused by the comparator offset presents a greater problem when measuring the capacitor mismatch than when performing the A/D conversion.

In the CMOS process, P-type and N-type MOS transistors (MOSFETs) may be formed in the standard manner in order to implement logic gate functions. However, to implement a charge distribution A/D converter on a semiconductor chip (integrated circuit), not only the MOSFETs but also the capacitive elements may be implemented on the integrated circuit. The capacitive elements are used, for example, in the capacitive main DAC and the comparator. The structures and electrical properties of the capacitive elements that may be implemented on integrated circuits have already been described.

More specifically, to achieve a 14-bit or higher resolution A/D converter, for example, the voltage dependence of the capacitive elements forming the capacitive main DAC may be made small enough to achieve the 14-bit resolution, but this employs the use of, for example, PIP capacitors or MIM capacitors.

However, the PIP capacitor has the problem that the manufacturing cost increases because it uses two polysilicon layers. That is, in a silicon gate MOS process, at least one polysilicon layer is used for forming the gate of the transistor, but the other polysilicon layer is nothing but an extra layer used only when forming the capacitive element.

The MIM capacitor also has the problem that the manufacturing cost increases, because the insulating film of the capacitor may be made thinner than the film formed between interconnect layers and the process employs an additional mask and fabrication step that are not used in the fabrication process that does not form MIM capacitors.

That is, if a 14-bit high-resolution A/D converter is to be implemented using related art techniques, PIP capacitors or MIM capacitors have to be used as the capacitive elements forming the capacitive main DAC, requiring additional fabrication steps, etc. for forming these capacitors, and thus increasing the manufacturing cost.

The above has described the problems associated with the capacitive elements used to form the capacitive main DAC, but it will also be recognized that capacitive elements (coupling capacitors) are also used for coupling between the differential circuits in the comparator. These coupling capacitors are, for example, C01, C02, C03, C04, etc. in FIG. 4, or C01, C02, etc. in FIG. 7.

The properties used of the capacitive elements in the comparator when implementing a high-resolution A/D converter will be described below along with their associated problems.

In a high-resolution A/D converter, the signal voltage corresponding to one LSB that the internal DAC outputs is very small. For example, assuming the case where bit decisions are made on the sign bit plus 14 bits by using a reference voltage of 5 V, the signal voltage corresponding to one LSB is given as $5V/2^{15}=153$ μV.

The comparator has to make a bit decision by sensing such a minuscule potential difference within a preferable period. If the speed of the comparator is slow, and it takes time to make a bit decision, the charge stored on the capacitive element will be destroyed by the sub-threshold leakage or junction leakage of the MOSFET that switches during the successive conversion cycle, and the desired resolution may not be achieved.

Therefore, the comparator may complete the bit decision in the shortest possible time. In particular, in the case of a high-resolution A/D converter, since the amount of charge leakage that may be tolerated is very small, it is critical to enhance the speed of the comparator.

In the circuit of FIG. 7, for example, the decision making speed of the comparator is determined primarily by the parasitic capacitance at the N1OM and N1OP nodes. The smaller the parasitic capacitance, the faster the decision making speed may be made, and conversely, the larger the parasitic capacitance, the slower the decision making speed. To reduce the parasitic capacitance of this portion, the parasitic capacitance at the electrode of each of the capacitors CO1 and CO2 that faces the first-stage differential circuit CMP1 in FIG. 7 may be reduced.

If MOS capacitors or poly-diffusion capacitors are used as the capacitors C01 and C02 in FIG. 7, there arises the problem that the parasitic junction capacitance at the N1OM and N1OP nodes increases. It is therefore desirable to form these elements using PIP or MIM capacitors; in this case, MIM capacitors may achieve a faster comparator than PIP capacitors.

However, as earlier described in connection with the capacitive main DAC, the MIM capacitor as well as the PIP capacitor has the problem that the manufacturing cost increases because of the use for additional fabrication steps, etc.

Further, as earlier described, it is known to enhance the speed of the comparator by using an equalizing switch, but in this case also, it is advantageous to minimize the parasitic capacitance at the output nodes of the differential circuit from the standpoint of enhancing the speed.

More specifically, if a high-resolution A/D converter is to be achieved, it is preferable to use PIP or MIM capacitors as the capacitive elements in the capacitate main DAC in order to avoid the influence that the voltage dependence has on the transfer characteristic. It is also desirable to use PIP or MIM capacitors as the coupling capacitors in the comparator in order to minimize the decision time. However, the fabrication of these capacitors employs an additional mask and fabrication step, resulting in the problem that the manufacturing cost increases.

Embodiments of A/D converters will be described in detail below. First, an overview of an A/D converter according to one embodiment will be given with reference to FIG. 9 and FIG. 12.

Figure 9:
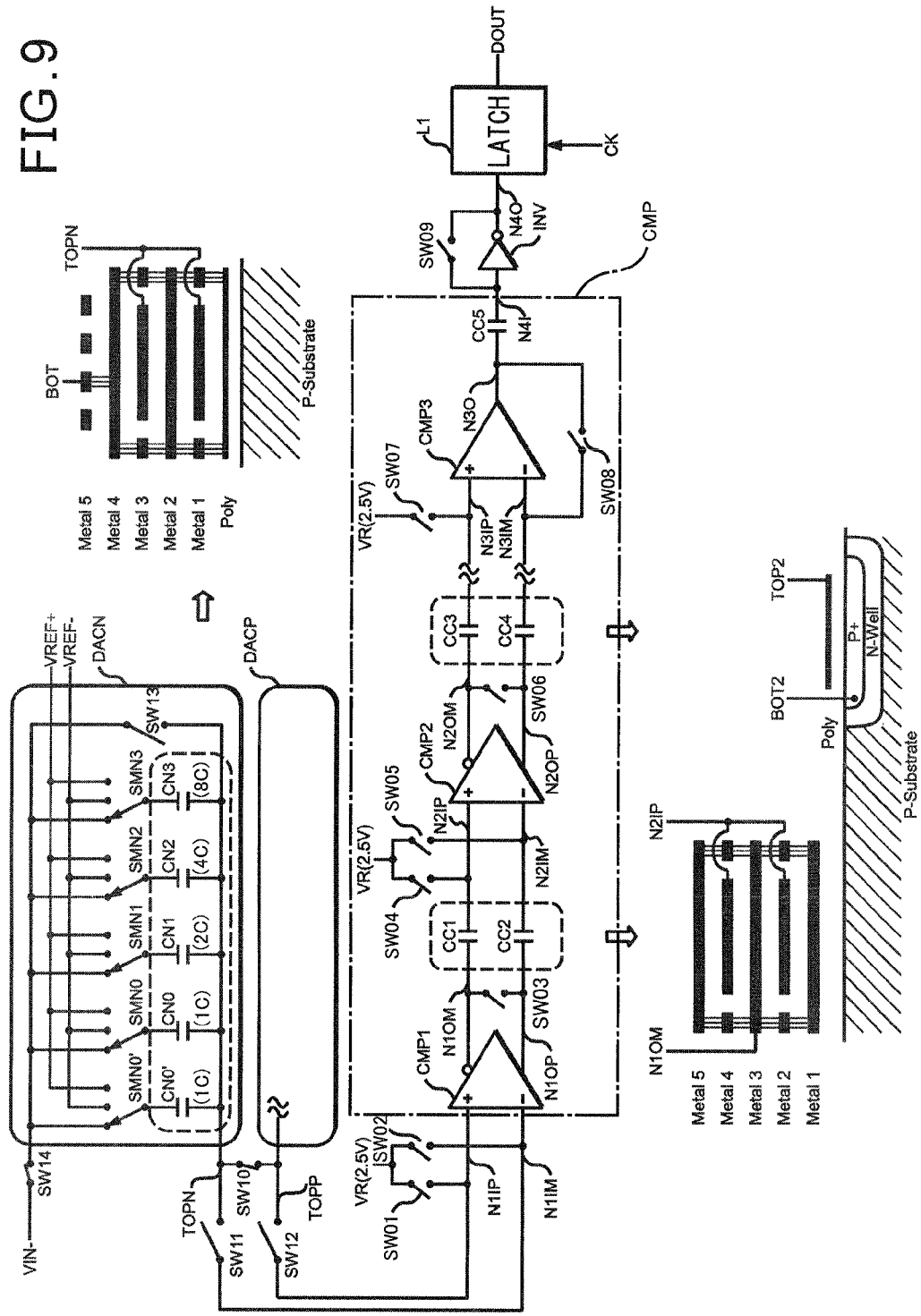
FIG. 9 is a block diagram illustrating an A/D converter according to one embodiment by focusing on a comparator.

FIG. 9 is a block diagram illustrating the A/D converter according to the one embodiment, by focusing on the comparator, for explaining the circuit configuration of the comparator and the structures of the capacitive elements (first capacitive elements) forming the capacitive DAC and the capacitive elements (second capacitive elements) forming the comparator. In FIG. 9, the resistive sub-DAC (resistive DAC), the resistive correction DAC, etc. are not illustrated, and the capacitive main DAC (capacitive DAC) is depicted in abstract form.

Figure 12:
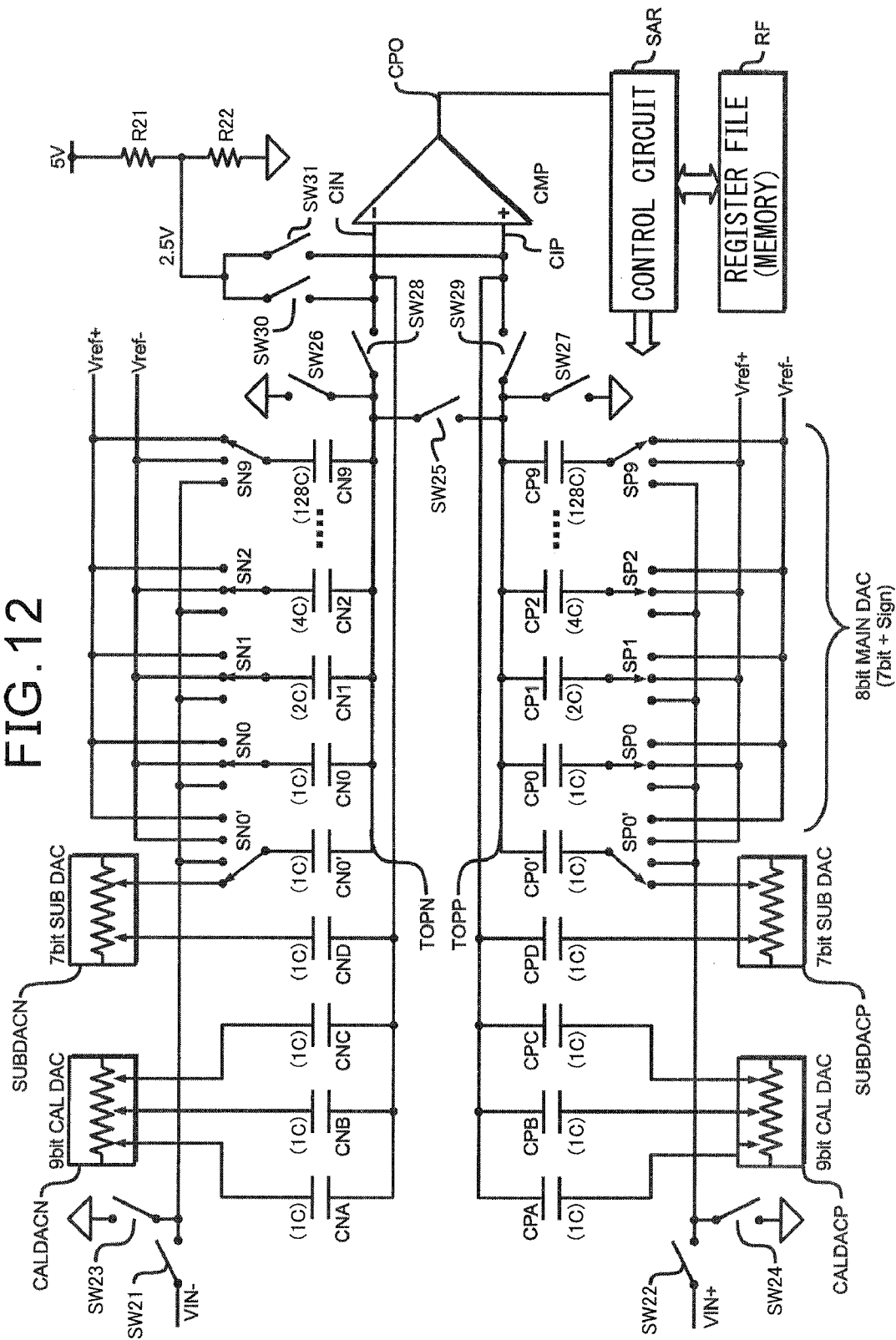
FIG. 12 is a block diagram illustrating the A/D converter according to the one embodiment by focusing on a capacitive main DAC and a resistive sub-DAC.

FIG. 12 is a block diagram illustrating the A/D converter according to the one embodiment by focusing on the capacitive main DAC and the resistive sub-DAC; here, the capacitive main DAC and the resistive sub-DAC not illustrated in FIG. 9 are illustrated in further detail, and instead, the comparator is depicted in abstract form. FIG. 12 illustrates an example of a 14-bit resolution A/D converter.

In FIG. 9, reference character CMP1 indicates the first-stage differential circuit, and CMP2 the second-stage differential circuit, while CMP3 represents a differential circuit inserted at the third or subsequent stage; on the other hand, INV indicates an inverter circuit, and L1 a latch.

Reference characters SW01, SW02, SW03, SW04, SW05, SW06, SW07, SW08, SW09, SW10, SW11, SW12, SW13, and SW14 indicate switches, and SMN0', SMN0, SMN1, SMN2, and SMN3 also indicate switches.

Reference characters CC1, CC2, CC3, CC4, and CC5 indicate capacitive elements, and CN0', CN0, CN1, CN2, and CN3 also indicate capacitive elements. DACN indicates a negative-side capacitive DAC (negative-side capacitive main DAC), and DACP a positive-side capacitive DAC (positive-side capacitive main DAC).

Further, reference character VIN− indicates an analog input node and its voltage, VR a voltage near the midpoint of the supply voltage, N1IP the positive-side input node of CMP1, and N1IM the negative-side input node of CMP1.

On the other hand, reference character N1OM indicates the negative-side output node of CMP1, N1OP the positive-side output node of CMP1, N2IP the positive-side input node of CMP2, and N2IM the negative-side input node of CMP2.

Further, reference character N2OM indicates the negative-side output node of CMP2, N2OP the positive-side output node of CMP2, N3IP the positive-side input node of CMP3, N3IM the negative-side input node of CMP3, and N3O the output node of the CMP3.

Reference characters N4I indicates the input node of INV, N4O the output node of INV, DOUT the output of L1, and CK a clock input to L1.

Designations Metal1, Metal2, Metal3, Metal4, and Metal5 respectively indicate (metal) interconnect layers, and Poly indicates a polysilicon layer; on the other hand, BOT indicates the switch-side node (bottom plate node) of each capacitive element.

Further, designation P+ indicates a highly doped P-type region, N-Well an N-type well region, and P-Substrate a P-type substrate.

In FIG. 12, reference characters R21 and R22 indicate resistive elements, and SW21, SW22, SW23, SW24, SW25, SW26, SW27, SW28, SW29, SW30, and SW31 indicate switches.

Reference characters CNA, CNB, CNC, and CND indicate capacitive elements, and CPA, CPB, CPC, and CPD also indicate capacitive elements; further, reference characters CN0', CN0, CN1, CN2, . . . , and CN9 indicate capacitive elements, and CP0', CP0, CP1, CP2, . . . , and CP9 also indicate capacitive elements. Designations 1C, 2C, 4C, . . . , and 128C attached to the capacitive elements indicate the relative sizes of the respective capacitors.

Reference characters SN0', SN0, SN1, SN2, . . . , and SN9 indicate switches in the negative-side main DAC, while SP0', SP0, SP1, SP2, . . . , and SP9 indicate switches in the positive-side main DAC.

Further, reference character TOPN indicate the top plate node of the negative-side main DAC, TOPP the top plate node of the positive-side main DAC, CIP the positive-side node of the comparator, CIN the negative-side node of the comparator, and CPO the output of the comparator.

Reference character Vref+ indicates a positive-side reference voltage, Vref− a negative-side reference voltage, SUBDACP a positive-side resistive sub-DAC, and SUBDACN a negative-side resistive sub-DAC.

Further, SAR indicates a control circuit (SAR: Successive Approximation Register), RF a register file (memory) for storing correction terms, and VIN+ a positive-side node for inputting an analog signal.

Reference character CALDACP indicates a positive-side resistive correction DAC, CALDACN a negative-side resistive correction DAC, VIN− a negative-side node for inputting an analog signal, and CMP the comparator.

The A/D converter (self-calibration successive approximation A/D converter) according to the one embodiment is designed so as to prevent the A/D conversion accuracy from worsening by eliminating the possibility of errors occurring in the measurement of the capacitor mismatch due to the residual offset of the comparator.

For this purpose, as illustrated in FIG. 9, the capacitive DAC circuits DACP and DACN, which also have the function of sampling, are provided on the positive and negative sides, respectively, and the corresponding weight bits in DACP and DACN are operated in a complementary fashion during the A/D conversion.

The switch SW10 is provided between the output nodes of DACN and DACP. Further, the output nodes of the negative-side capacitive main DAC (DACN) and the positive-side capacitive main DAC (DACP) are connected via the respective switches SW11 and SW12 to the input nodes N1IP and N1IM of the comparator CMP1.

N1IP and N1IM are provided with the switches SW01 and SW02, respectively, for applying a bias voltage whose magnitude is about one-half of the supply voltage. The first-stage differential circuit CMP1 and the second-stage differential circuit CMP2 are coupled by the coupling capacitors CC1 and CC2, and the switch SW03 is provided between N1OM and N1OP.

The positive-side and negative-side resistive correction DACs (CALDACP and CALDACN in FIG. 12) are provided in order to correct the positive-side and negative-side capacitive main DACs (DACP and DACN), respectively. The positive-side correction DAC (CALDACP) is responsible for correcting the error of the positive-side capacitive main DAC (DACP), and the negative-side correction DAC (CALDACN) is responsible for correcting the error of the negative-side capacitive main DAC (DACN). In this case, CALDACP and CALDACN do not operate in a complementary fashion.

Thus, according to the A/D converter of the present embodiment, it becomes possible to reduce the residual offset that occurs in the comparator during the error measurement. Next, the operation of the A/D converter illustrated in FIG. 9 will be described.

To initiate the error measurement, first a pair of capacitors to be measured is set in DACP or DACN; then, SW10 is opened (OFF), SW11 and SW12 are closed (ON), SW01 and SW02 are also closed, SW03 is opened, and SW04 and SW05 are opened. Further, SW06 is opened, SW07 and SW08 are closed, and SW09 is closed. As a result, TOPP and TOPN are charged to the potential VR.

Next, SW01, SW02, SW04, SW05, SW07, SW08, and SW09 are opened, thus performing control so as to invert the setting of DACP or DACN. At this time, the charge from SW01 is injected onto TOPP and the charge from SW02 onto TOPN; here, by forming these switches identical in shape, the amount of charge injection may be made substantially the same between the two, and as a result, the direction of the potential change also becomes the same.

In this way, the influence of the charge injection occurring on TOPP and TOPN may be canceled out. This serves to significantly reduce the amount of offset contained in the measurement result, compared with the earlier described related art. Furthermore, since the decision made by the comparator is free from the influence of offset, the accuracy of the capacitor error measurement improves, and thus a high-accuracy A/D converter may be achieved.

The A/D converter (self-calibration successive approximation A/D converter) according to the one embodiment is also designed so as to achieve high-speed, high-accuracy A/D conversion at low cost without having to use capacitive elements that employ additional fabrication steps.

Generally, in the polysilicon layer, the impurity concentration is increased or the surface is treated with metallization, such as one called silicidation, in order to reduce the gate resistance. Further, the metal layers, each formed from a metal such as aluminum or copper, have the advantage of being able to reduce the voltage dependence of the capacitive elements, and thus achieve the elements having the electrical properties suitable for a high-resolution A/D converter.

In the capacitor array forming the capacitive main DAC (DACN, DACP) illustrated in FIG. 9, the top plate (TOPN) is common to all the capacitive elements, and the bottom plate of each capacitive element is connected to its associated switch. Since the capacitive elements are formed by arranging unit capacitors in a two-dimensional plane, bottom plate connections are relatively complex.

On the other hand, in the case of the top plate, connections use only be made between adjacent capacitors. In view of the situation in which the top plate (TOPN) connections are less crowded than the bottom plate connections, a high-accuracy capacitive DAC may be achieved in a small area by employing, for example, the structure illustrated in the cross-sectional view in the upper part of FIG. 9.

In the capacitor array forming DACN and DACP, if parasitic capacitance (capacitance other than the intended one formed between the electrodes) occurs between the top plate and the bottom plate, the correlation between the capacitors that may normally be binary weighted is disrupted, which may cause the accuracy of the A/D conversion to degrade.

In view of this, the uppermost interconnect layer is used as a dedicated interconnecting channel, and each capacitor is formed by using the other interconnect layers and the polysilicon layer.

Further, the structure of the capacitive elements (first capacitive elements) is such that the top plate is sandwiched by the bottom plate when viewed in the thickness direction of the semiconductor substrate and that a shield is provided around the four sides of the top plate electrode when viewed in the direction parallel to the surface of the semiconductor substrate.

In this way, the complex connections may be achieved while maintaining the structure for preventing degradation of accuracy. The details of the capacitive elements forming the capacitive DAC will be described later with reference to FIG. 10A to FIG. C.

Next, if the capacitive elements used for inter-stage coupling in the comparator are formed as illustrated, for example, in the cross-sectional view in the lower part of FIG. 9, the function of the capacitive main DAC may be achieved without having to use elements such as PIP or MIM capacitors that employ additional fabrication steps.

Here, since the decision making time of the comparator is mostly determined by the operating speed of the first-stage differential circuit CMP1, the parasitic capacitance of CC1 and CC2 becomes minimized.

By forming CC1 and CC2 by using the lowermost to uppermost metal interconnect layers but not using the polysilicon layer, capacitive elements having reduced parasitic capacitance may be achieved. The polysilicon layer, which is formed in close proximity to the substrate (P-Substrate), has relatively large capacitive coupling to ground. Therefore, by not using the polysilicon layer, the decrease in comparator speed may be minimized. The details of the capacitive elements (second capacitive elements) forming the comparator will be described later with reference to FIG. 11A to FIG. 11C.

As described above, in the capacitor array circuit forming the capacitive main DAC, for example, the uppermost interconnect layer is used as a dedicated interconnecting channel, but in the case of the coupling capacitive elements (second capacitive elements), such as CC1 and CC2 in FIG. 9, used in the comparator, since the two-terminal structure suffices for the purpose, the connections are less crowded.

In view of this situation, the coupling capacitive elements are formed by also using the uppermost layer as a capacitor electrode in order to enhance the area efficiency by increasing the capacitance per area. As a result, the capacitance per area is not much different from that in the capacitive main DAC.

The following describes the relationship between the total capacitance $(CN0'+CN0+CN1+CN2+CN3)$ of DACP or DACN and the capacitance values of CC1 and CC2.

In the A/D conversion, the analog signal is directly sampled by the capacitive main DAC, and signals multiplied by the gain of CMP1 are applied to CC1 and CC2. It is therefore appropriate that CC1 and CC2 may each be chosen to have a value equal to the quotient of $(CN0'+CN0+CN1+CN2+CN3)$ by the gain of CMP1.

For example, if the gain of CMP1 in FIG. 9 is 10, the value of CC1 is designed to be equal to one-tenth of $(CN0'+CN0+CN1+CN2+CN3)$, and since the area is substantially proportionate to that, the increase in area resulting from the use of the interconnect layers for forming the coupling capacitors in the comparator is negligible.

On the other hand, capacitors such as poly-diffusion capacitors may be used as the coupling capacitors (CC3, CC4, CC5: third capacitive elements) for CMP2 and subsequent stages. That is, since the decision making speed of the comparator is less affected by the response speed of the differential circuits at the second and subsequent stages than that of the differential circuit at the first stage, the use of poly-diffusion capacitors does not present any problem. Rather, the use of poly-diffusion capacitors has the advantage that the capacitance per area becomes larger than when the capacitors are formed using the interconnect layers.

The A/D converter according to the one embodiment will be described in detail below with reference to the accompanying drawings. As earlier stated, FIG. 9 is a block diagram illustrating the A/D converter according to the one embodiment by focusing on the comparator; more specifically, the diagram illustrates by way of example the connections in the capacitive main DAC and the comparator along with the device structures of the capacitors used in the capacitive main DAC and the comparator. In FIG. 9, the correction DAC used to implement the self-calibration function is omitted, and the capacitive main DAC is illustrated as being a 4-bit DAC for simplicity of illustration. The portion related to the self-calibration will be described later with reference to another drawing.

First, to achieve a 14-bit or higher resolution A/D converter, for example, the voltage dependence of the capacitive elements forming the capacitive main DAC may be made sufficiently small. The capacitor mismatch may be corrected by using self-calibration techniques, but the voltage dependence may not be corrected.

The PIP or MIM capacitor is a device structure that achieves a capacitor having a sufficiently small voltage dependence, but the fabrication of such capacitors employs additional fabrication steps different from those for forming MOS transistors. This has been described earlier.

In the A/D converter illustrated in FIG. 9, the capacitive elements in the capacitive DAC circuit are formed by using the Poly, Metal1, Metal2, Metal3, Metal4, and Metal5 interconnect layers. The Poly layer is also used as the gate of the transistor, and may be formed as a highly doped layer in order to reduce the gate resistance. Alternatively, as is generally the case, the Poly layer may be formed by treating the surface with metallization called silicidation. The Poly layer may therefore be regarded as having substantially the same property as a metal.

The metal interconnect layers other than the Poly layer are formed from aluminum or copper. In view of this, if the capacitive elements in the capacitive main DAC are formed by also including the Poly (polysilicon) layer, and the connections on the uppermost layer are used as the bottom plate connections, then capacitors whose voltage dependence is small may be achieved without requiring any additional step.

For example, in the case of a 14-bit or higher resolution A/D converter, since the potential difference corresponding to one LSB is very small, it takes a longer time to make a bit decision in the comparator and the conversion speed thus becomes slower than a lower resolution A/D converter. In the A/D converter, the successive conversion may be completed before the sampled signal charge is destroyed by the subthreshold leakage or junction leakage of the switch, but in a high-resolution A/D converter, the degree of signal charge destruction that may be tolerated is smaller than in a lower resolution A/D converter. Therefore, the bit decision may be completed in a short time.

The coupling capacitors (second capacitive elements) CC1 and CC2 in the comparator are formed by using the Metal1, Metal2, Metal3, Metal4, and Metal5 interconnect layers but not using the Poly layer which is used in the case of the capacitors (first capacitive elements) in the capacitive main DAC.

This structure offers the effect of reducing the parasitic capacitance at the first stage of the comparator and thus enhancing the decision making speed. That is, since the comparison period may be shortened, the decay of signal charge due to leakage current may be reduced and the conversion accuracy may be further increased.

The A/D converter of the present embodiment is constructed by combining the coupling capacitors CC1 and CC2 that do not use the Poly layer with the capacitors CN3 to CN0 that use the Poly layer. By thus utilizing the complexity of the connections in the capacitive main DAC and the simplicity of the connections in the comparator, it becomes possible to solve not only the problem of the comparator speed but also the problem of the voltage dependence of the capacitive DAC.

Here, all the coupling capacitors in the comparator may be formed by not using the Poly layer but by using the other interconnect layers, as described above, but the capacitors to be formed in this way may be limited, for example, to the coupling capacitors CC1 and CC2 at the first stage of the comparator (i.e., the capacitors between the first-stage differential circuit CMP1 and the second-stage differential circuit CMP2.

That is, in the embodiment of FIG. 9, the coupling capacitors (CC3 and CC4) between the second-stage differential circuit CMP2 and the third-stage differential circuit CMP3 are formed from poly-diffusion capacitors which are of a different type of capacitor than the coupling capacitors CC1 and CC2 used at the first stage. That is, if at least the coupling capacitors CC1 and CC2 at the first stage are formed using the interconnect layers, the capacitors at the subsequent stages may be formed using other structures, because the coupling capacitors at the second and subsequent stages do not have a significant effect on the speed even if the parasitic capacitance is large.

Using poly-diffusion capacitors as the coupling capacitors (CC3 and CC4) at the subsequent stages has the potential of being able to further reduce the used silicon area. The reason is that the insulating film of a MOS capacitor or poly-diffusion capacitor may be formed relatively thin, that is, as thin as or nearly as thin as the gate oxide film of a MOS transistor, and thus the capacitance per area may be increased.

That is, when CC3 and CC4 in the A/D converter of FIG. 9 are formed from poly-diffusion capacitors, the effect may be obtained that the area taken up by the comparator may be reduced without increasing the comparison time of the comparator.

In this way, in the A/D converter of FIG. 9, CC1 and CC2 are formed by not using the Poly layer, and CN3 to CN0 are formed by also using the Poly layer, while CC3 and CC4 are formed from poly-diffusion capacitors. With this arrangement, the area taken up by the comparator may not only be reduced as a whole, but also the problem of the comparator speed and the problem of the voltage dependence of the capacitive DAC described above may be solved.

As described above, the capacitive elements in the capacitive DAC, the coupling capacitors at the first-stage output of the comparator, and the coupling capacitors at the second and subsequent stages of the comparator are formed using respectively different structures that do not employ any additional fabrication step.

With this design, the ease of bottom plate connections and the small voltage dependence used of the DAC may be achieved together with the reduced parasitic capacitance used of the coupling capacitors at the first stage of the comparator and the reduced area used of the coupling capacitors at the second and subsequent stages of the comparator. As a result, a high-resolution A/D converter may be achieved that does not take up much silicon area and that does not employ a complex fabrication process.

FIG. 10A, FIG. 10B and FIG. 10C are diagrams illustrating the structure of the first capacitive elements in the A/D converter of FIG. 9, more specifically, the capacitive elements CN0', CN0, CN1, CN2, and CN3 forming the capacitive main DAC (DACP, DACN).

Here, FIG. 10A to FIG. 10C illustrate three of the first capacitive elements arranged side by side: FIG. 10A is a cross-sectional view, FIG. 10B is a top plan view of the Poly layer, and FIG. 10C is a top plan view of the Metal1 layer.

More specifically, FIG. 10A is a cross-sectional view taken along the thickness direction of the semiconductor substrate (P-Substrate) when the A/D converter (transistors, capacitors, resistors, etc.) is fabricated on the semiconductor substrate by using the Poly layer and the Metal1 to Metal5 layers.

Top plan views of the Metal2 to Metal5 layers are not illustrated here. The drawings here are illustrated only for the purpose of explaining the structure and are not drawn to scale. Further, while designation VIA is illustrated only at one location in the figure, it will be appreciated that other similarly depicted inter-layer connecting portions are also vias.

In FIG. 10A to FIG. 10C, designations Metal1, Metal2, Metal3, Metal4, and Metal5 indicate the respective interconnect layers, and Poly designates the polysilicon layer, while P-Substrate designates the P-type semiconductor substrate.

On the other hand, reference character BOT1 indicates the bottom plate of the first capacitor, BOT2 the bottom plate of the second capacitor, BOT3 the bottom plate of the third capacitor, and TOP the node common to the capacitors.

Further, reference characters SLD1, SLD2, and SLD3 indicate shield structure portions provided in order to prevent the TOP connections from capacitively coupling with unintended nodes, and VIA represents an inter-layer connecting via.

As illustrated in FIG. 10A, the capacitive elements CN0', CN0, CN1, CN2, and CN3 are parallel plate capacitors each formed by using the Poly layer and the interconnect layers (Metal1 to Metal4) other than the uppermost layer (Metal5). Here, when viewed in the thickness direction of the semiconductor substrate, one electrode TOPP, TOPN is sandwiched by the other electrode.

Further, as illustrated in FIG. 10A to FIG. 10C, when viewed in the direction parallel to the surface of the semiconductor substrate, the electrode at one end of the capacitor is placed around one electrode TOPP, TOPN, and a grounded shield is provided around the periphery of the electrode at the other end of the capacitor. The uppermost interconnect layer Metal5 is used to form bottom plate connections for the capacitor array.

As illustrated in DACN in FIG. 9, the capacitive main DAC is implemented by a circuit in which the binary weighted capacitive elements are connected together at one end to TOPN and connected at the other end to their associated switches. Here, one electrode on the TOPN side of each capacitor is called the top plate, and the other electrode the bottom plate.

In DACN illustrated in FIG. 9, the capacitive elements CN0', CN0, CN1, CN2, and CN3 are designated as binary weighted, but in a practical circuit, the capacitive elements are formed by arranging, for example, capacitive elements identical in shape (unit capacitors) in a two-dimensional plane and connecting the preferable number of capacitors in parallel. By thus arranging the unit capacitors, there is offered the advantage of facilitating capacitor matching.

When interconnecting the capacitive elements arranged in a two-dimensional plane, the top plate connections are common to all the capacitors, but the bottom plate connections have to be connected to as many switches as the number of resolution bits. That is, while the top plate connections are simple, the bottom plate connections are complex and crowded.

It is therefore reasonable to use the uppermost interconnect layer Metal5 as the bottom plate connections and to form the capacitors by using the other interconnect layers Metal1 to Metal4 and the Poly layer. The diagram in the upper part of FIG. 9 and the diagrams of FIG. 10A to FIG. 10C illustrate the capacitive element structure by assuming the fabrication process that forms one polysilicon (Poly) layer and five metal interconnect layers.

One problem that arises in the capacitive element structure is the formation of parasitic capacitance other than the capacitive elements. For example, if unintended capacitive coupling occurs between the top plate connection (TOP in FIG. 10A and FIG. 10C) and the bottom plate connection (BOT1, BOT2, or BOT3 in FIG. 10A to FIG. 10C), the correlation between the capacitors that may be binary weighted is disrupted, which may cause the accuracy of the A/D conversion to degrade.

To prevent this, the capacitor structure is such that the top plate is sandwiched by the bottom plate. Further, the bottom plate is arranged around the four sides of the top plate. This structure serves to prevent TOP of each capacitive element from capacitively coupling with other connections.

The structure also includes connections for bringing the TOP node outside the capacitor array; here also, care may be taken so that unintended parasitic capacitance does not occur on these connections. In the example of FIG. 10A to FIG. 10C, the shields (SLD1, SLD2, and SLD3) are provided around the respective capacitive elements to prevent the TOP connections from capacitively coupling with unintended nodes.

The TOP connections may not necessarily be provided around the four sides of the capacitive element portion, the only employment being that the TOP node be brought outside the capacitor array. However, it is desirable that connections that are not directly used be also simply arranged; by employing such a structure, the capacitors may be formed more uniformly at the time of manufacture.

The above may be used of all other interconnect layers. For example, in the Metal5 layer in FIG. 10A, undesirable bottom plate connections are also simply arranged, and connections are made to the preferable portions by forming vias; in this way, the capacitor array may be formed more uniformly.

By thus forming the capacitive elements and constructing the capacitive array circuit in a two-dimensional plane, as illustrated in the example of FIG. 10A to FIG. 10C, it becomes possible to construct a capacitive DAC circuit that has greatly reduced voltage dependence and that achieves high area efficiency and good matching.

Figure 11A:
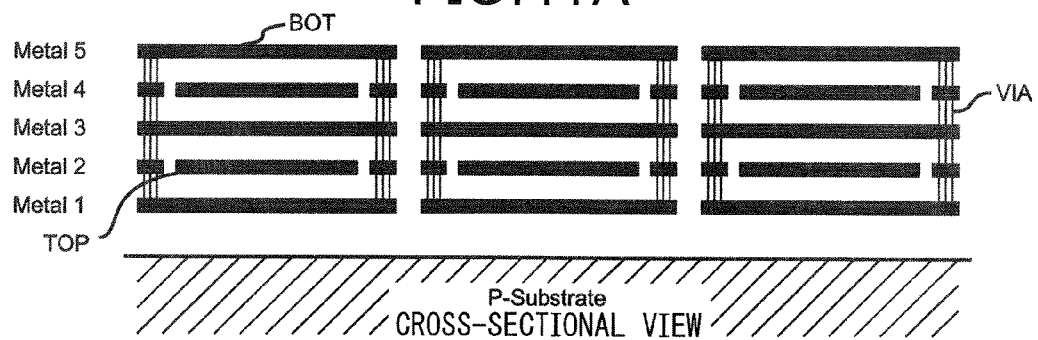
FIG. 11A, FIG. 11B and FIG. 11C are diagrams illustrating the structure of second capacitive elements in the A/D converter of FIG. 9.
Figure 11B:
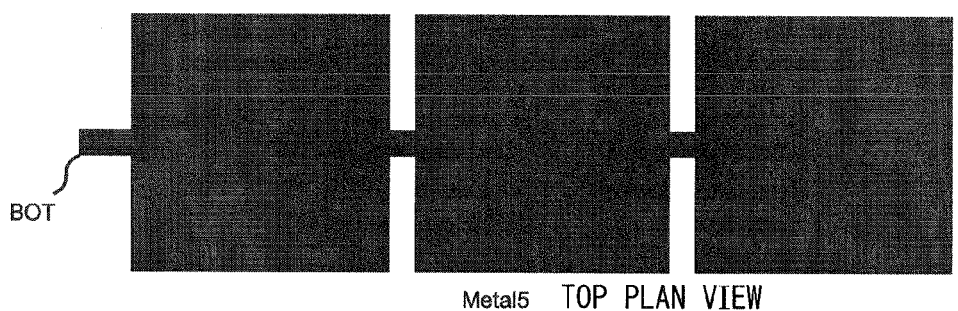
Figure 11C:
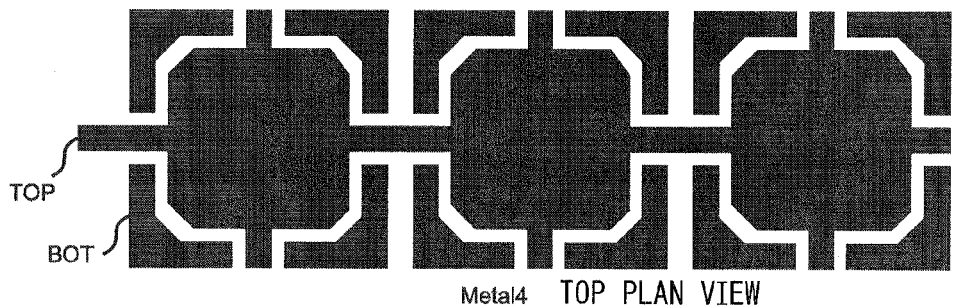

FIG. 11A, FIG. 11B and FIG. 11C are diagrams illustrating the structure of the second capacitive elements in the A/D converter of FIG. 9, that is, the coupling capacitive elements forming the comparator.

Here, FIG. 11A to FIG. 11C illustrate three of the second capacitive elements arranged side by side: FIG. 11A is a cross-sectional view, FIG. 11B is a top plan view of the Metal5 layer, and FIG. 11C is a top plan view of the Metal4 layer.

More specifically, FIG. 11A is a cross-sectional view taken along the thickness direction of the semiconductor substrate (P-Substrate) when the A/D converter (transistors, capacitors, resistors, etc.) is fabricated on the semiconductor substrate by using the Poly layer (not illustrated) and the Metal1 to Metal5 layers.

Top plan views of the Metal1 to Metal3 layers are not illustrated here. The drawings here are illustrated only for the purpose of explaining the structure and are not drawn to scale. Further, while designation VIA is illustrated only at one location in the figure, it will be appreciated that other similarly depicted inter-layer connecting portions are also vias.

In FIG. 11A to FIG. 11C, designations Metal1, Metal2, Metal3, Metal4, and Metal5 indicate the respective interconnect layers, and P-Substrate designates the P-type substrate. Further, reference character BOT indicates the bottom electrode node of the capacitor, TOP the top electrode node of the capacitor, and VIA an inter-layer connecting via.

In FIG. 11A to FIG. 11C, the three capacitors arranged side by side are connected in parallel to form a capacitive element having capacitance three times as great as the capacitance of each unit capacitor. That is, to fabricate the capacitive elements stably, it may not be preferable to make the metal area excessively large in some applications; therefore, relatively small capacitive elements are formed side by side, and connected in parallel to obtain the desired capacitance.

More specifically, as is apparent from the Metal5 layer in FIG. 11B, the three electrodes are interconnected, and as is apparent from the Metal4 layer in FIG. 11C, the three electrodes on the Metal4 are also interconnected.

The coupling capacitors in the comparator, in particular, the capacitors (second capacitive elements) CC1 and CC2 inserted between the first-stage differential circuit CMP1 and the second-stage differential circuit CMP2, may become a factor that reduces the operating speed of the comparator (CMP) if the parasitic capacitance to ground is large.

To avoid the operating speed reduction of the comparator, the second capacitive elements are formed by not using the lowermost interconnect layer (Poly layer). This is where the structure differs from that of the earlier described capacitive main DAC in which the capacitors (first capacitive elements) are formed by also using the lowermost Poly layer.

In the comparator, the coupling capacitors may only be provided at two nodes, the first-stage node and the second stage-node. The situation thus differs from that of the earlier described capacitive main DAC in which the bottom plate connections in the capacitor array are crowded.

Accordingly, the second capacitive elements may be formed by directly connecting the TOP electrodes of the adjacent capacitors and also directly connecting the BOT connections of the adjacent capacitors; furthermore, since the TOP connections are simple, the shields may be eliminated.

As illustrated in FIG. 9, in the A/D converter of the present embodiment, the comparator circuit for comparing the output potential difference of the capacitive main DAC is constructed from a plurality of stages of differential circuits, CMP1, CMP2, and CMP3, which are connected by the respective coupling capacitor pairs CC1, CC2 and CC3, CC4.

Here, at least the coupling capacitors CC1 and CC2 inserted between the first-stage and second-stage differential circuits CMP1 and CMP2 are formed by using the lowermost (Metal1) to uppermost (Metal5) interconnect layers. Further, as illustrated in FIG. 11A to FIG. 11C, the structure of the coupling capacitors CC1 and CC2 is such that the electrode at the first stage side of the capacitor formed from the interconnect layers is arranged around the four sides of the electrode at the second stage side of the capacitor.

The coupling capacitors CC3 and CC4 at the second and subsequent output stages are formed using the lowermost to uppermost metal interconnect layers, as in the coupling capacitors CC1 and CC2 inserted between the first and second stages, or formed from MOS or poly-diffusion capacitors.

By forming the capacitive elements as described above, capacitive elements having reduced parasitic capacitance may be achieved at low cost, and the comparator speed may thus be enhanced; as a result, a high-speed, high-accuracy A/D converter may be achieved.

FIG. 12 is a block diagram illustrating the A/D converter according to the one embodiment by focusing on the capacitive main DAC and the resistive correction DAC. The reference characters in FIG. 12 are the same as those illustrated previously, and therefore will not be further described herein.

In the A/D converter of FIG. 12, the capacitive main DAC (designated as 8-BIT MAIN DAC) is responsible for bit decisions on the sign bit and the high-order seven bits of the 14-bit conversion resolution, and the conversion of the low-order seven bits is allocated to the resistive sub-DAC. Here, to reduce the time constant of the output node and to enhance the speed of operation, the resistive sub-DAC is divided into high-order and low-order sections and has two voltage outputs.

The high-order voltage output of SUBDACP is connected to TOPP via the capacitor CP0', and the low-order voltage output is connected to CIP via CPD. Likewise, the high-order voltage output of SUBDACN is connected to TOPN via the capacitor CN0', and the low-order voltage output is connected to CIN via CND.

In the A/D converter of FIG. 12, 9-bit correction DACs (CALDACN, CALDACP) for canceling out capacitor mismatch are provided in addition the capacitive main DAC and the resistive sub-DAC that perform the conversion of 14 bits. The correction DACs are used to implement the self-calibration function.

The positive-side and negative-side correction DACs are each divided, for example, into three voltages which are connected to the comparator via respective coupling capacitors. Since the correction DAC resolution is higher than the resistive sub-DAC resolution by two bits, the correction DAC may make a correction with a resolution four times finer than one LSB of the 14-bit A/D conversion.

In the A/D converter of FIG. 12, the charge held in the capacitive main DAC is released before initiating the sampling of an analog signal. For this purpose, first the switches SW21 and SW22 are opened, SW25 is closed, and SW28 and SW29 are opened. Further, SN0', SN0, . . . , and SN9 are connected to VIN−, and SW26 and SW23 are closed.

At the same time, SP0', SP0, . . . , and SP9 are connected to VIN+, and SW27 and SW24 are closed; further, SW30 and SW31 are also closed. With this operation, the charges stored on CN0', CN0, . . . , CN9 and CP0', CP0, . . . , CP9 are reduced to zero, the potential difference between CIN and CIP becomes zero, and CIN and CIP are biased to 2.5 V.

Next, the sampling is initiated. To initiate the sampling, SW23, SW24, SW26, and SW27 are opened, and SW21 and SW22 are closed. With this operation, VIN+ is applied to the bottom plates of the positive-side capacitors in the capacitive main DAC, and VIN− is applied to the bottom plates of the negative-side capacitors. At the same time, the potentials at TOPP and TOPN are each brought to a potential intermediate between VIN+ and VIN−.

After the sampling is done, SW25 is opened to end the sampling, and SW21 and SW22 are also opened. As a result, the bottom plates of the capacitive elements in the positive-side and negative-side capacitive main DACs are isolated from the analog input voltage, and TOPP and TOPN are put in a floating state; the sampled charges are thus held, being unable to escape.

Then, to start the successive conversion, SW30 and SW31 are opened, and SW28 and SW29 are closed. After that, SP0', SP0, . . . , SP9 and SN0', SN0, . . . , SN9 are connected to the reference potential to start the successive conversion. Bit decisions are made starting from the most significant bit, and after the value of the capacitive main DAC has been determined, bit decisions are made on the lower order bits by using the resistive sub-DAC. The sequence of operations performed here is the same as previously described with dereference to the related art A/D converter, and therefore, the details thereof will not be described here.

During the successive conversion, the correction DAC operates so as to correct the capacitive main DAC. The operation of the correction DAC will be described later with reference to another drawing.

In the A/D converter of FIG. 12, when ending the sampling, SW25 was opened, SW30 and SW31 were opened, and SW28 and SW29 were closed. Here, by forming the source and drain of SW25 identical in shape, the degree of effect that SW25 has on CIP and CIN may be made substantially the same so that the direction of the potential change becomes the same, and hence, no offset occurs. Further, in the case of the switch pairs SW30, SW31 and SW28, SW29, by forming the switches in each pair identical in shape, no offset occurs here.

Next, a description will be given of the operation when measuring the capacitor mismatch by using the example of the 14-bit A/D converter illustrated in FIG. 12. The measurement of the capacitor mismatch is performed, for example, when power is turned on to an apparatus (circuit) in which the A/D converter is provided. Then, data for correcting the measured capacitor mismatch is written to the register file RF.

That is, in the capacitor mismatch measuring mode, SW21 and SW22 are opened, SW23 and SW24 are opened, SW26 and SW27 are opened, SW25 is opened, SW28 and SW29 are closed, and the outputs of SUBDACN and SUBDACP are fixed, for example, to ground.

When measuring the capacitor mismatch, SW30 and SW31 are closed to charge the capacitor pair to be measured. Then, for example, when measuring the error between CP9 and its complementary capacitor, SP9 is connected to Vref+ and SP0', SP0, . . . , SP8 are connected to Vref−. At this time, SN0', SN0, . . . , SN9 are held fixed. By closing SW30 and SW31, TOPP and TOPN are charged to the same potential and biased to 2.5 V.

After the capacitors have been sufficiently charged, SW30 and SW31 are opened, SP9 is connected to Vref−, and SP0', SP0, . . . , SP8 are connected to Vref+. As a result, a voltage change proportional to the difference between CP9 and (CP0'+CP0+CP1+CP2+CP3+CP4+CP5+CP6+CP7+CP8) occurs on CIP. On the other hand, no voltage change occurs on CIN.

Then, the comparator senses the potential difference between the charged CIP and CIN, and operates CALDACP to search for a digital code of CALDACP that brings the potential difference closest to zero. The finally obtained digital code represents the degree of capacitor mismatch.

The above example has specifically illustrated the case where a comparison is made between CP9 and (CP0'+CP0+CP1+CP2+CP3+CP4+CP5+CP6+C7+CP8), but the mismatch measurement is made on every capacitor pair to be matched in the lower order bits. Further, the mismatch measurement in the negative-side DAC is performed in the same manner as the positive-side DAC.

The above has described the operation when measuring the capacitor mismatch by using the A/D converter of FIG. 12. Since the A/D converter of FIG. 12 employs a circuit configuration in which the capacitive main DAC is constructed from a differential pair and the sampling of the input signal is performed in a differential manner, a differential signal that may become preferable in a high-resolution conversion, as in the related art circuit, may be A/D converted. Furthermore, since the comparator is also constructed in a differential configuration, unwanted charge injection from the switches may be canceled out, and the residual offset of the comparator may be significantly reduced.

By providing the correction DAC for each of the positive side and negative side of the differential DAC, and by measuring errors in the capacitors on one side by using the symmetrically configured switch groups provided on the positive and negative sides, the feature that may significantly reduce the residual offset of the comparator may be utilized when measuring the errors.

That is, according to the A/D converter of the present embodiment, there is offered the effect that, since the residual offset is small, capacitor errors may be measured with high accuracy and, as a result, the conversion accuracy after the self-calibration improves.

Then, by combining the differential DAC and the positive-side and negative-side correction DACs with the capacitor structure of CDAC illustrated in FIG. 9 and FIG. 10A to FIG. 10C, not only may the problem of the voltage dependence be solved without using any additional steps, but also any mismatch in capacitor value may be canceled out by using the technique of error correction.

That is, the above combination offers the effect of being able to simultaneously solve the problem of the voltage dependence of the capacitive elements and the problem of manufacturing variations and to achieve a high-accuracy successive approximation A/D converter using a low-cost process.

Further, by also using the capacitor structure of CC1 and CC2, illustrated in FIG. 11A to FIG. 11C, that does not use the polysilicon layer, there is offered the effect of being able to reduce the delay time of the comparator. Since the comparison period may thus be shortened, the decay of signal charge due to leakage current may be reduced and the conversion accuracy may be further enhanced.

By further using the structure of CC3 and CC4 illustrated in FIG. 9, there is offered the effect of being able to reduce the area taken up by the entire circuit without increasing the delay time of the comparator. That is, a high-accuracy successive approximation A/D converter may be achieved at low cost.

As described above, by employing the capacitor structures described with reference to FIG. 9 to FIG. 11C and the circuit configuration illustrated in FIG. 9 and FIG. 12, a high-resolution A/D converter may be achieved without using PIP or MIM capacitors. Further, an A/D converter may be achieved that may reduce the effect of the residual offset at the time of error measurement which was not touched on in the related art self-calibration A/D converter.

Figure 13:
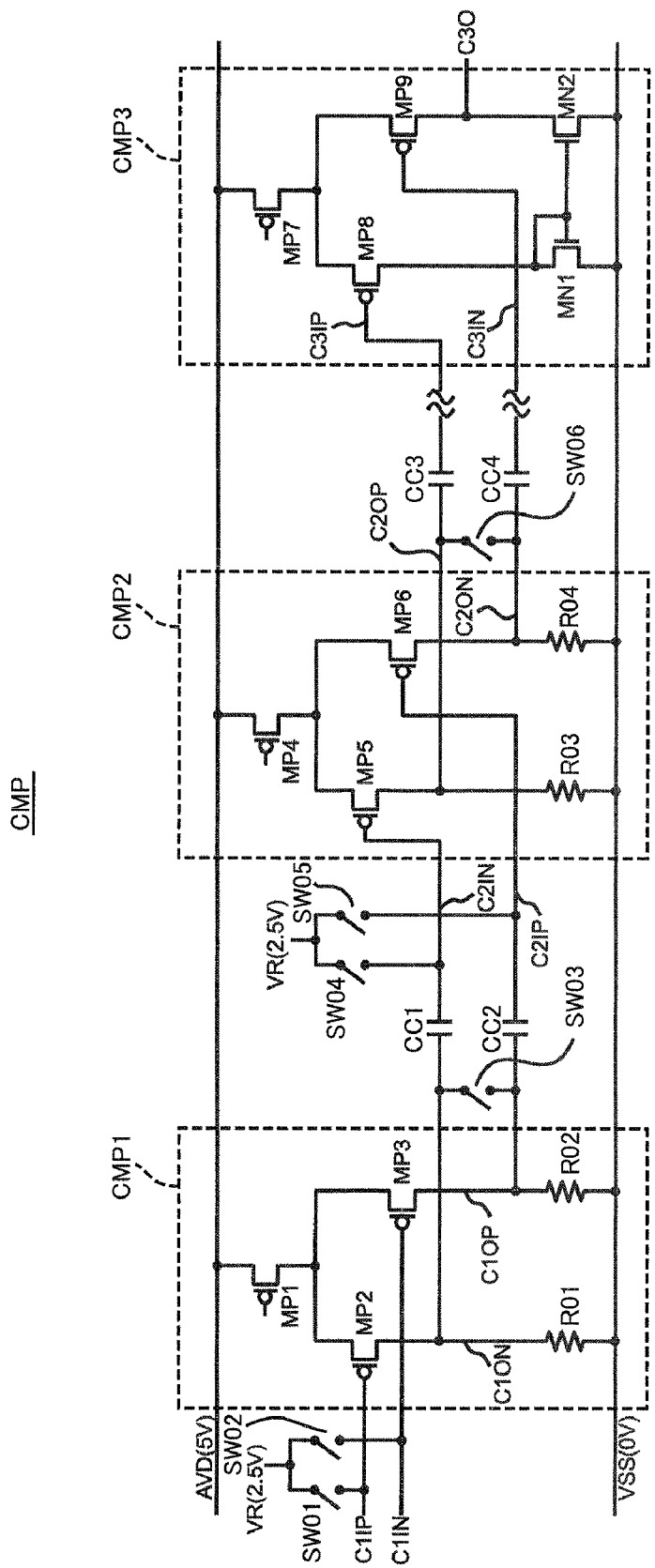
FIG. 13 is a circuit diagram illustrating one example of the comparator in the A/D converter of FIG. 12.

FIG. 13 is a circuit diagram illustrating one example of the comparator circuit in the A/D converter of FIG. 12. In FIG. 13, reference character ADV indicates the supply voltage and its node, VSS a ground voltage (0 V) and its node, and VR a voltage (for example, 2.5 V) approximately equal to one-half of the supply voltage, while SW01, SW02, SW03, SW04, SW05, and SW06 designate switches.

Reference characters CC1, CC2, CC3, and CC4 indicate capacitive elements, and R01, R02, R03, and R04 indicate resistive elements, while MP1, MP2, MP3, MP4, MP5, MP6, MP7, MP8, and MP9 designate pMOS transistors.

Further, reference characters MN1 and MN2 designate nMOS transistors, and C1IP, C1IN, C1ON, C1OP, C2IN, C2IP, C2OP, C2ON, C3IP, C3IN, and C3O indicate nodes in the circuit. Next, the operation of the comparator circuit illustrated in FIG. 13 will be described.

First, during the period that the A/D converter is performing sampling in the A/D conversion cycle, the switches SW01, SW02, SW04, and SW05 are held closed (ON) and SW03 and SW06 are held open (OFF).

As a result, the nodes C1IP and C1IN are charged to the same potential and biased to 2.5 V. Likewise, C2IN and C2IP are also charged to the same potential and biased to 2.5 V.

At this time, a potential difference occurs between C1OP and C1ON due to the difference in characteristics between the transistors MP2 and MP3, and further, a potential difference occurs between C2OP and C2ON due to the difference in characteristics between MP5 and MP6. Since this potential difference corresponds to the output offset of the differential circuit, it may be used that the output offset is applied to CC1 and CC2. The same may be used of CC3 and CC4.

After the sampling is completed, SW01, SW02, SW04, and SW05 are opened. Thereupon, the output offset of the first-stage differential pair is stored on CC1 and CC2, and the output offset of the second-stage differential pair is stored on CC3 and CC4.

At this time, potential difference information that the capacitive main DAC outputs is applied to C1IP and C1IN, but since the differential pair offset information is stored on the internal capacitors, the offset is canceled out in the comparator as a whole.

When SW01 and SW02 are opened after the offset has been stored, charge injection occurs from SW01 and SW02 onto C1IP and C1IN. However, by forming these switches identical in shape, the amount of charge injection from these switches may be made substantially the same between them, and the potential difference between C1IP and C1IN may be maintained at zero. For SW04 and SW05 also, the offset due to the charge injection may be substantially eliminated in like manner.

FIG. 13 depicts only three stages of differential circuits, but in practice, as many stages as preferable to obtain the preferable gain are provided. Then, the potential difference information amplified through the preferable number of stages is converted at the last stage into a large amplitude single-ended signal which is supplied to a logic circuit.

In the comparator of FIG. 13, the first-stage and second-stage circuits CMP1 and CMP2 are depicted as resistive load differential circuits and the third-stage (last-stage) circuit CMP3 as a differential-input, single-output differential circuit, but the third-stage circuit CMP3 may also be implemented in the same circuit configuration as employed for the first-stage and second-stage circuits.

Further, the differential circuits CMP1, CMP2, and CMP3 are designed so that each differential circuit supplies a larger bias current than its succeeding differential circuit.

As earlier described, the operating speed of the comparator is mostly determined by the operating speed of the first-stage differential circuit; here, in order to maximize the operating speed of the first-stage differential circuit CMP1, the parasitic capacitance occurring at the left-side nodes of CC1 and CC2 may be reduced.

In the circuit of FIG. 13, at least CC1 and CC2 are formed by using the interconnect layers other than the lowermost layer (Poly layer); this serves to reduce the parasitic capacitance and enhance the operating speed of the comparator.

Here, when applying the circuit configuration of FIG. 13 to the comparator in the A/D converter illustrated in FIG. 12 (or FIG. 9), if R01 and R02 in FIG. 13 are formed from non-silicided polysilicon (high-resistivity Poly) resistors, further speedup may be achieved by reducing the parasitic capacitance.

Figure 14:
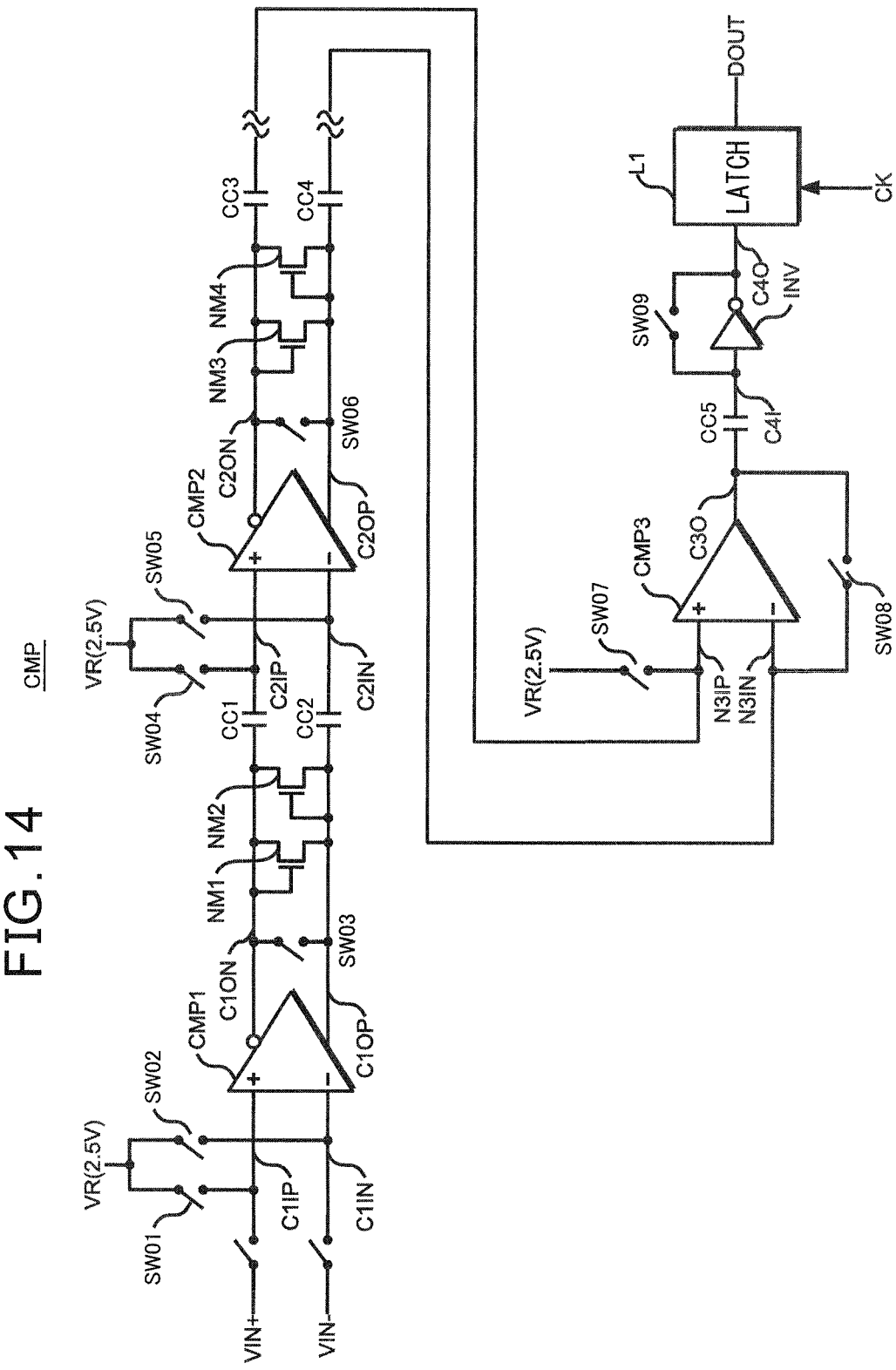
FIG. 14 is a circuit diagram illustrating another example of the comparator in the A/D converter of FIG. 12.

FIG. 14 is a circuit diagram illustrating another example of the comparator circuit in the A/D converter of FIG. 12. In FIG. 14, reference character VIN+ indicates the positive-side input node and its voltage, and VIN− the negative-side input node and its voltage; on the other hand, CMP1, CMP2, and CMP3 designate differential circuits, and NM1, NM2, NM3, and NM4 indicate nMOS transistors.

Further, reference characters CC1, CC2, CC3, CC4, and CC5 indicate capacitive elements, and SW01, SW02, SW03, SW04, SW05, SW06, SW07, SW08, and SW09 indicate switches, while INV denotes an inverter, L1 a latch, and CK a clock.

Reference character DOUT indicates the node at which the decision result is output from the comparator and the value of that result, and C1IP, C1IN, C1OP, C1ON, C2IP, C2IN, C2OP, C2ON, C3IP, C3IN, C3O, C4I, and C4O indicate nodes in the circuit.

In the circuit diagram of FIG. 14, the differential circuits depicted at the transistor level in FIG. 13 are depicted in a block form, and the last-stage circuit portion of the comparator, which was omitted in FIG. 13, is also depicted here.

In the comparator illustrated in FIG. 14, the diode-connected nMOS transistors NM1 and NM2 are connected between the nodes C1ON and C1OP, and the diode-connected nMOS transistors NM3 and NM4 are connected between the nodes C2ON and C2OP.

Here, the diode-connected transistors NM1 and NM2 between C1ON and C1OP are connected in such a manner that their polarities are opposite to each other, and the diode-connected transistors NM3 and NM4 between C2ON and C2OP are also connected in such a manner that their polarities are opposite to each other.

By connecting the diode-connected MOS transistors in this way, it becomes possible to limit the output amplitude of each differential circuit. It will be recognized here that the devices connected between C1ON and C1OP and those connected between C2ON and C2OP are not limited to diode-connected nMOS transistors, the only employment being that the devices be able to limit the output amplitude.

That is, when the gate-source voltage of a MOS transistor is applied, the threshold voltage may vary due to its stress, and this variation may be memorized and may exhibit hysteresis. If such a memory effect appears during a search operation in the A/D conversion, an error may occur in the conversion result of the A/D converter.

In view of this, the diode-connected MOS transistors NM1, NM2 and NM3, NM4 are connected as illustrated in FIG. 14, to limit the output amplitude and thereby prevent A/D conversion errors.

Figure 15A:
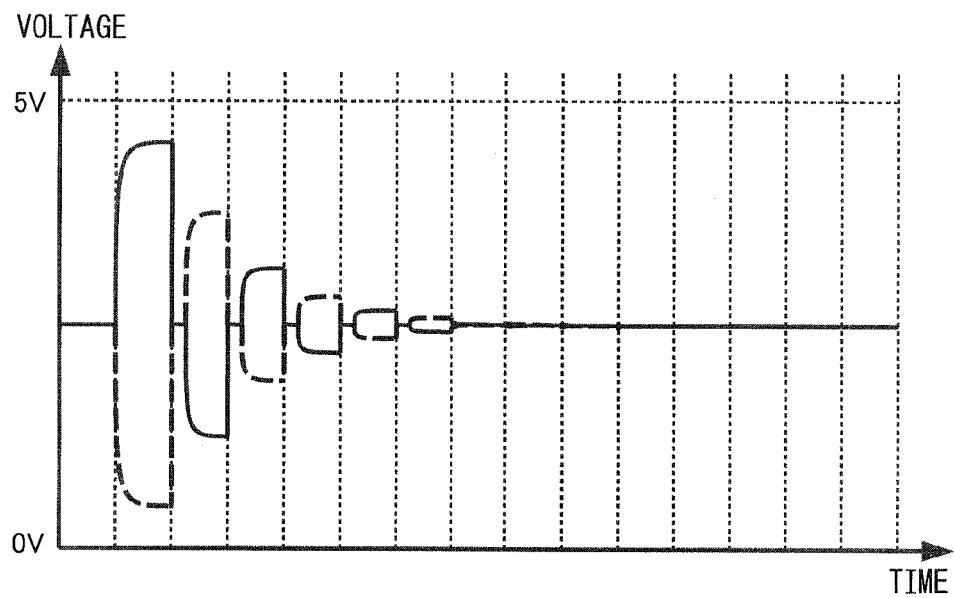
FIG. 15A and FIG. 15B are diagrams for explaining the operation of the comparator of FIG. 14.
Figure 15B:
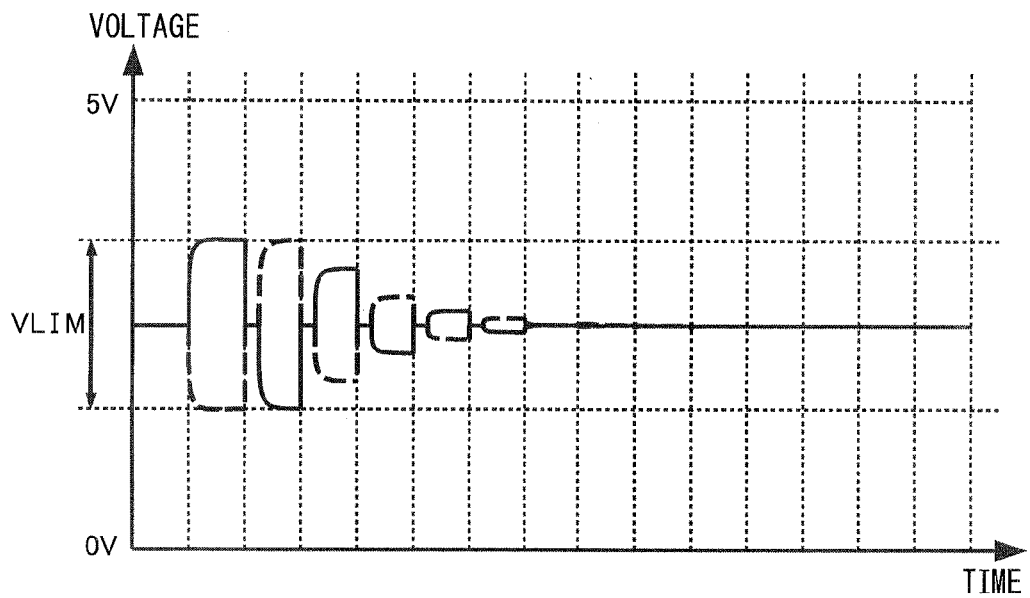

FIG. 15A and FIG. 15B are diagrams for explaining the operation of the comparator of FIG. 14, illustrating the voltage waveform at the differential output nodes C1OP and C1ON of the differential circuit CMP1. FIG. 15A illustrates the voltage waveform when the output amplitude is not limited, and FIG. 15B illustrates the voltage waveform when the output amplitude is limited using NM1 and NM2.

That is, as illustrated in FIG. 15A, when the diode-connected amplitude limiting circuit is not provided, the voltage at the nodes C1OP and C1ON becomes close to the supply voltage, especially when making a decision on the high-order bit, and this applies a large stress to the second-stage differential circuit CMP2.

On the other hand, as illustrated in FIG. 15B, when the diode-connected amplitude limiting circuit (NM1, NM2) is provided, since the potentials at C1OP and C1ON are limited, the stress to the second-stage differential circuit CMP2 is alleviated.

In this way, in the comparator CMP of FIG. 14, by providing the amplitude limiting devices at the output of each differential circuit in addition to the equalizing switch, the output amplitude is prevented from increasing excessively at the time of amplification in the differential circuit (comparator) after equalizing.

As a result, the voltage applied to each transistor may be reduced, and the possibility of a carrier being trapped at the oxide film and causing a Vth shift may thus be avoided. If the Vth varies during the conversion, a conversion error may occur; therefore, by applying the circuit configuration of FIG. 14 to the comparator in the A/D converter of FIG. 12 or FIG. 9, it becomes possible to further enhance the A/D conversion accuracy.

Figure 16:
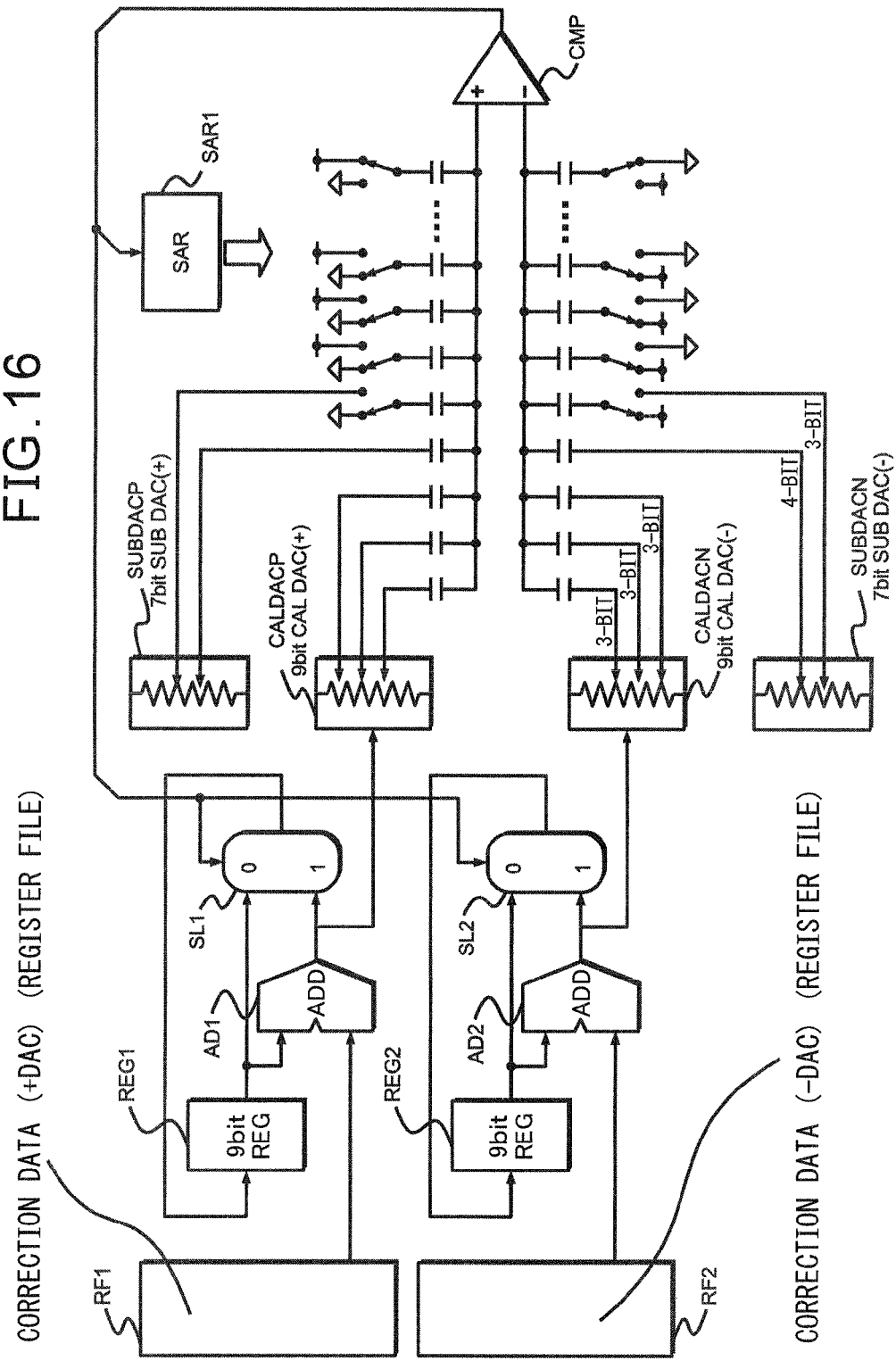
FIG. 16 is a diagram for explaining error correction control in one example of a 14-bit self-calibration successive approximation A/D converter.

FIG. 16 is a diagram for explaining error correction control in one example of the 14-bit self-calibration successive approximation A/D converter.

In FIG. 16, reference character SUBDACP indicates the positive-side resistive sub-DAC, SUBDACN the negative-side resistive sub-DAC, CALDACP the positive-side resistive correction DAC, and CALDACN the negative-side resistive correction DAC.

Further, reference characters RF1 and RF2 are register files, REG1 and REG2 are resisters, AD1 and AD2 are adders, SL1 and SL2 are selectors, CMP is a comparator, and SAR1 is a successive approximation control circuit (Successive Approximation Register).

In the circuit of FIG. 16, the resistive sub-DAC (SUBDACP, SUBDACN) has a 4-bit voltage output for high-order bits and a 3-bit voltage output for low-order bits, and these outputs are connected to the capacitive main DAC via coupling capacitors.

The resistive correction DAC (CALDACP, CALDACN) has a 3-bit voltage output for high-order bits, a 3-bit voltage output for middle-order bits, and a 3-bit voltage output for low-order bits, and these outputs are connected to the capacitive main DAC via coupling capacitors. This circuit portion is the same as the resistive correction DAC illustrated in FIG. 12.

By dividing the respective outputs of the resistive sub-DAC and the resistive correction DAC and capacitively adding them as illustrated in FIG. 12 and FIG. 16, the time constants of the resistive sub-DAC and the resistive correction DAC may be reduced, achieving the speed-enhancing effect.

Then, by combining them with the A/D converter of FIG. 12 or FIG. 9, the speed of the high-accuracy successive approximation A/D converter may be further enhanced. The speed-enhancing effect of these resistive DACs contributes to further increasing the accuracy, because the decay of signal charge due to leakage current may be reduced by shortening the conversion time, just as when the speedup of the comparator is achieved.

The error of the capacitive main DAC measured by measuring the capacitor mismatch may be converted into an amount (correction data) by which the capacitive element responsible for each bit is to be corrected. The two register files RF1 and RF2 are provided in order to store the correction data. The amount of correction to be applied is stored in RF1 for the positive-side capacitive DAC and in RF2 for the negative-side capacitive DAC.

In the A/D conversion process, first a comparison and decision is made on the most significant bit, then a comparison and decision is made on the second significant bit, and then a comparison and decision is made on the third significant bit. This process is repeated for all other bits until the least significant bit is reached.

In FIG. 16, the error correction control is performed by calculating the amount of correction appropriate to the digital code input to the capacitive main DAC at each stage and by applying the correction using the resistive correction DAC (CALDACP, CALDACN).

To perform the correction for each of the positive-side and negative-side capacitive main DACs independently of each other, the resistive correction DAC is divided into two independent DACs each of which calculates the amount of correction independently of each other. For this purpose, the correction data register files RF1 and RF2, the registers REG1 and REG2, the adders AD1 and AD2, and the selectors SL1 and SL2 are provided one for each of the positive-side and the negative-side control.

Next, the error correction control operation performed in one example of the self-calibration successive approximation A/D converter will be described. First, it is assumed that REG1 is cleared to 0.

When making a comparison on the most significant bit after sampling, RF1 outputs a correction value corresponding to the capacitive element responsible for the most significant bit. Since the output of REG1 is 0, the value output from RF1 is passed unaltered to CALDACP. By the time that the comparison period of the most significant bit ends, CMP has done the decision and output "1" or "0".

At the instant that the decision period of the second significant bit begins, the most significant bit correction value output from RF1 is stored in REG1 if the result of the decision indicates that the most significant bit is "1"; however, if it is "0", the value of REG1 is stored.

Next, in the comparison and decision period of the second bit, RF1 outputs a correction value corresponding to the capacitive element responsible for that second bit. Then, this value is added to the value of REG1, and the result is supplied to SL1 and CALDACP.

Thereafter, the amount of correction appropriate to the capacitive main DAC code is successively output in like manner to the correction DAC. After the high-order bits have been determined by the capacitive main DAC, a search is performed for the low-order bits by the resistive sub-DAC (SUBDACP, SUBDACN), but since the weights assigned in the resistive sub-DAC are small compared with the dynamic range of the A/D conversion, it often suffices for the purpose if no correction is made.

Figure 17:
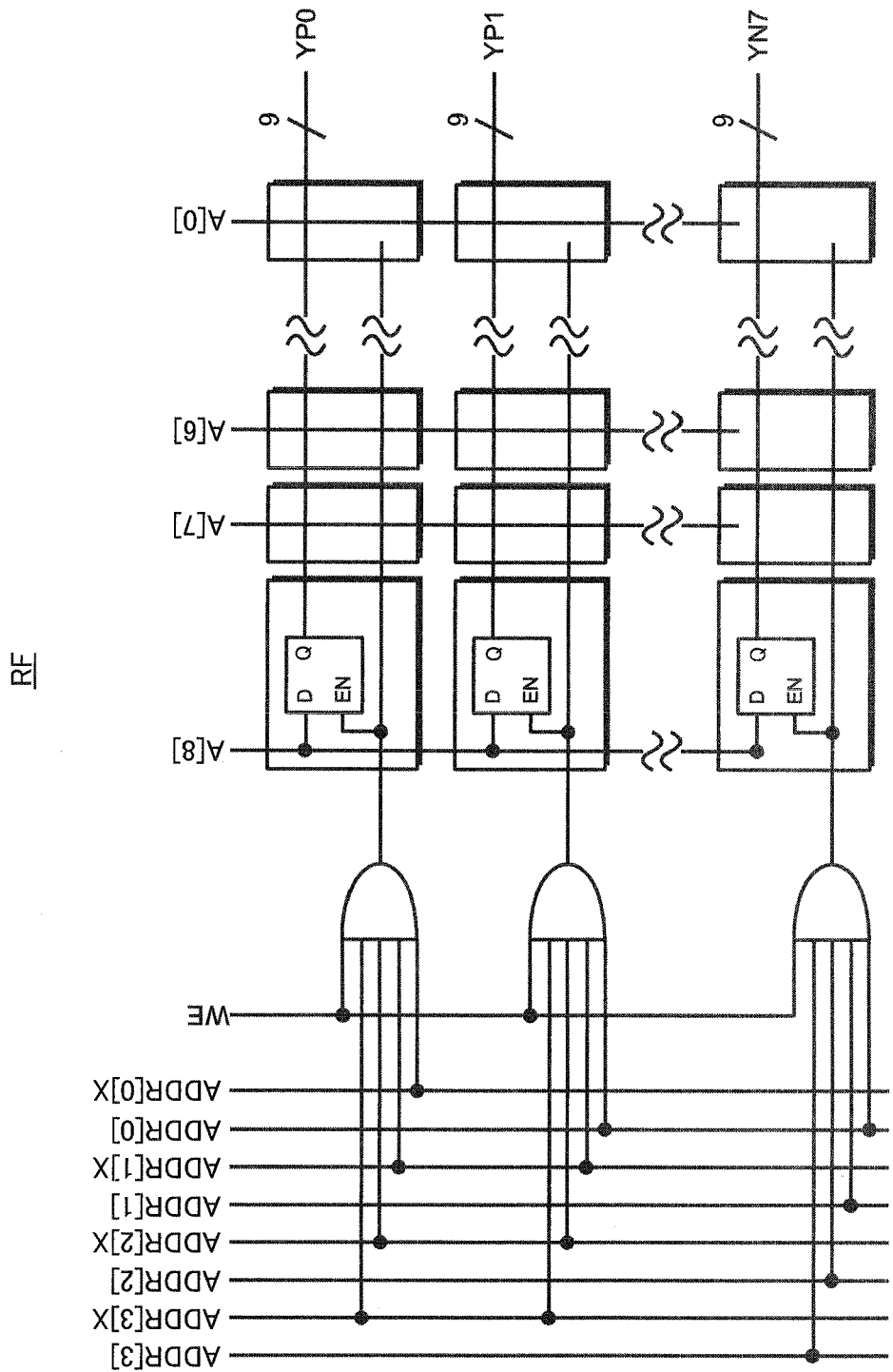
FIG. 17 is a circuit diagram illustrating one example of a correction data register file in the A/D converter.

FIG. 17 is a circuit diagram illustrating one example of the correction data register file RF in the A/D converter. Assuming the case where the 7-bit capacitive main DAC is corrected using the 9-bit correction DAC, the correction data register file here provides a 9-bit, 16-word correction term register file for correcting each of the positive-side and negative-side capacitive main DACs.

In FIG. 17, reference characters ADDR[3], ADDR[2], ADDR[1], and ADDR[0] indicate address input terminals. On the other hand, ADDR[3]X, ADDR[2]X, ADDR[1]X, and ADDR[0]X indicate the terminals at which the inverted signals of ADDR[3], ADDR[2], ADDR[1], and ADDR[0] are input.

Further, reference character WE indicate write enable, A[8], A[7], A[6], . . . , and A[0] indicate data input terminals for writing the register file, and YP0, YP1, YP0, . . . , and YN7 indicate the output data of the register file.

When writing error data to the register file, WE is driven, for example, to "1", and the write address and the data to be written are set. Since the address locations range from "0" to "15", the correction data is written to the respective address locations.

The purpose of the correction data register file RF is to hold the correction value for each of the capacitive elements forming the capacitive main DAC. Therefore, the correction data register file depicted in FIG. 17 is only one example, and illustrates the case where each cell of the register file is implemented by one DFF. It will be appreciated that the correction data register file may be implemented in some other suitable form.

Figure 18:
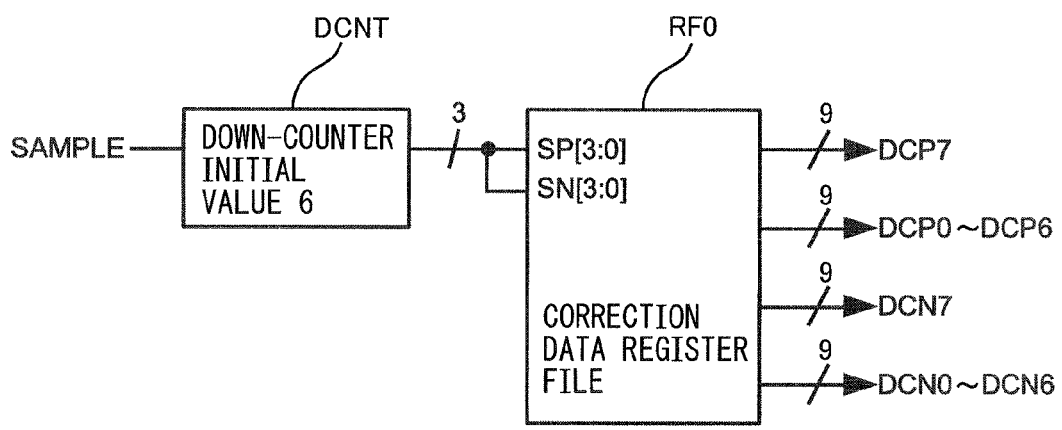
FIG. 18 is a block diagram illustrating one example of a readout circuit for reading correction data from the correction data register file of FIG. 17.
Figure 19:
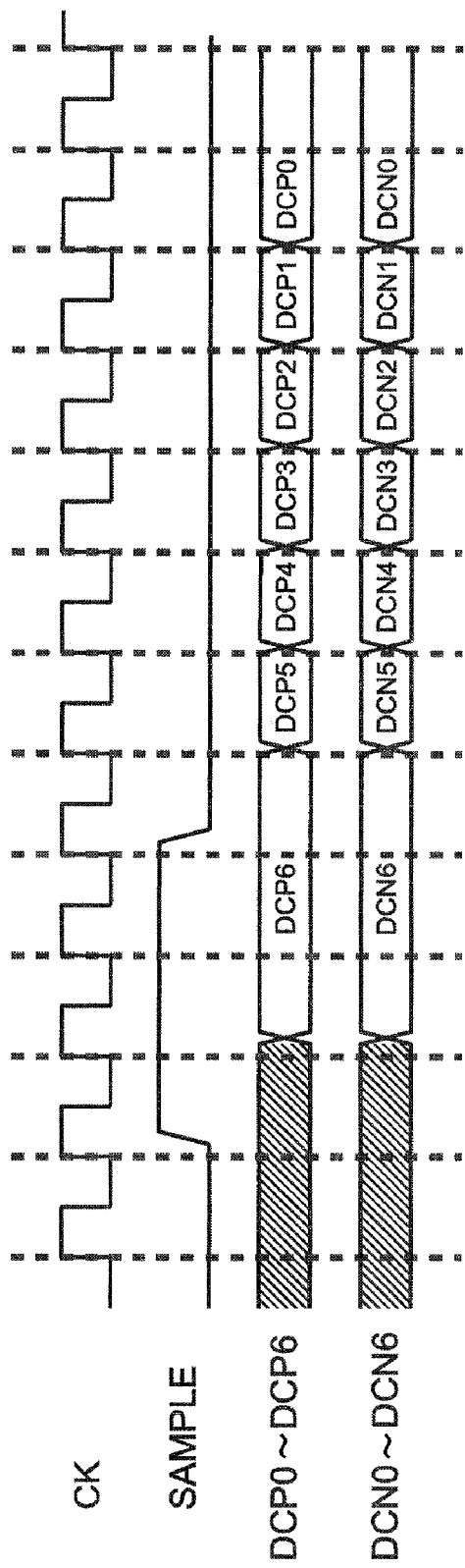
FIG. 19 is a diagram for explaining the operation of the data read circuit of FIG. 18.

FIG. 18 is a block diagram illustrating one example of a readout circuit for reading the correction data from the correction data register file of FIG. 17, and FIG. 19 is a diagram for explaining the operation of the readout circuit of FIG. 18.

In FIG. 18, down-counter DCNT is a counter which is initially set to "6" and which decrements the value on each rising edge of the clock, and correction data register file RF0 is a storage device for storing, for example, the correction data illustrated in FIG. 17.

Here, reference character DCP7 designates the correction value for the MSB capacitor in the positive-side capacitive main DAC, and DCP0 to DCP6 designate the correction values for the respective capacitors, other than the MSB capacitor, in the positive-side capacitive main DAC, while DCN7 designates the correction value for the MSB capacitor in the negative-side capacitive main DAC.

Further, DCN0 to DCN6 designate the correction values for the respective capacitors, other than the MSB capacitor, in the negative-side capacitive main DAC, while CK designates the clock and SAMPLE a signal specifying the sample period.

The operation of the correction DAC control circuit has already been described with reference to FIG. 16, and the structure of the correction data register file has already been described with reference to FIG. 17. FIG. 18 illustrates an example of the correction term data readout control circuit which performs control when correcting the capacitive main DAC during the A/D conversion by using the above control circuit and the correction data register file.

In FIG. 18, it is assumed that the down-counter DCNT is initialized to "6" when SAMPLE is set to "1". When SAMPLE is set to "0", the counter counts down on each rising edge of the clock.

Since this counted down value indicates the address in the correction data register file RF0, data values are successively output starting from the data at address 6. The output data is supplied to the adder AD1, AD2 in FIG. 16.

Figure 20:
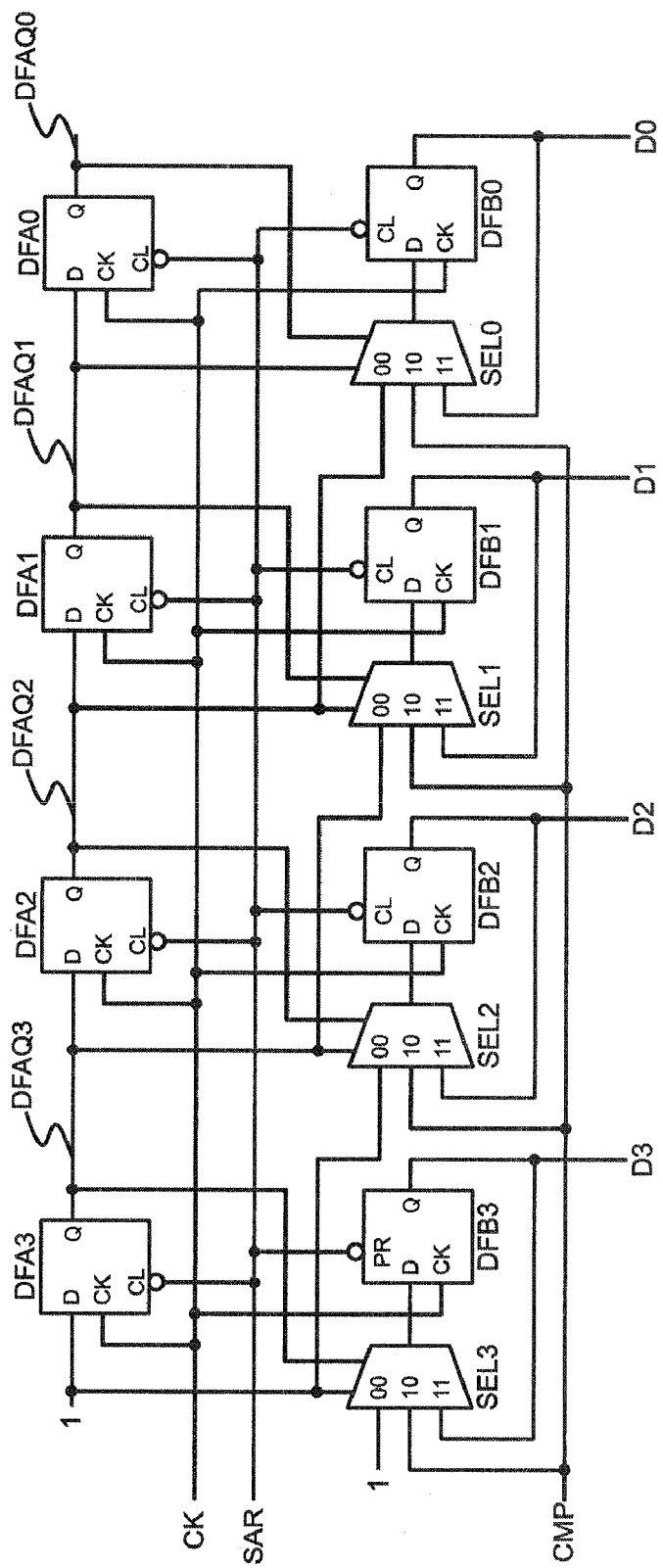
FIG. 20 is a circuit diagram illustrating one example of a SAR control logic circuit in the A/D converter.

FIG. 20 is a circuit diagram illustrating one example of the SAR control logic circuit SAR in the A/D converter. The SAR control logic circuit (successive approximation control circuit) SAR is used to perform a binary search in the A/D conversion process when searching for a DAC input code where the sampled analog voltage becomes equal to the output voltage of the internal DAC.

In the error measurement process, a voltage proportional to the error is generated; the SAR control logic circuit SAR is also used to measure this voltage.

In FIG. 20, reference characters DFA3, DFA2, DFA1, and DFA0 are D-type flip-flops, SEL3, SEL2, SEL1, and SEL0 are selectors, and DFB3, DFB2, DFB1, and DFB0 are D-type flip-flops.

On the other hand, reference character CK indicates a clock input node and its signal, SAR a binary search start signal input node and its signal, and CMP a comparator decision result input node and its signal.

Further, reference characters DFAQ3, DFAQ2, DFAQ1, and DFAQ0 indicate the outputs of DFA3, DFA2, DFA1, and DFA0, and D3, D2, D1, and D0 are control codes to be supplied to DAC.

In FIG. 20, the resolution of the successive approximation is cut to 4 bits for simplicity of illustration, but in practice, the circuit is constructed to have the resolution preferable for the A/D conversion or for the measurement of capacitor mismatch.

In the initial state, CK is supplied with the clock, and SAR is set to "0". In this state, DFA3, DFA2, DFA1, and DFA0 are cleared, and DFAQ3, DFAQ2, DFAQ1, and DFAQ0 are "0". At the same time, DFB2, DFB1, and DFB0 are cleared, and D2, D1, and D0 are "0". DFB3 is preset, and D3 is "1".

When the sampling is completed, SAR is set to "1" to start the conversion. In the comparison of the most significant bit, since D3=1, D2=0, D1=0, and D0=0, as described above, CMP changes to "1" or "0". At this time, since select signal "10" is applied to SEL3, the value of CMP is latched into DFB3 by the next rising edge of the clock.

When the decision of the most significant bit is completed, the conversion of the second significant bit begins, whereupon CK rises and DFAQ3 thus changes to "1". As a result, the conversion result of the most significant bit appears at D3, and the select signal to SEL3 changes to "11", so that DFB3 thereafter continues to hold the value. At the same time, the select signal to SEL2 is set to "10" so that the value of CMP is applied to DFB2.

When the decision of the second bit is completed, the comparison of the third bit begins. Thereupon, CK rises and "1" thus propagates to DFAQ2. At the same time, the value of CMP is latched into DFB2, and the select signal to SEL2 changes to "11", so that DFB2 continues to hold the value. Thereafter, bit decisions are made in like manner until the least significant bit is reached.

As described above, SAR in FIG. 12 or SR1, SAR2 in FIG. 16 may be implemented, for example, using the circuit illustrated in FIG. 20. In practice, more complex control may become preferable depending on how the circuits are implemented, but the method and operation for implementing the binary search that is fundamental to the circuit is the same as described herein.

In this way, according to the A/D converter of the present embodiment, it becomes possible to solve the problem that the effect of the correction is impaired by the comparator offset in the capacitor mismatch measurement, for example, in a single-ended self-calibration successive approximation A/D converter.

Furthermore, according to the A/D converter of the present embodiment, since the differential input configuration may be employed, a high-resolution A/D conversion circuit having enhanced immunity to the common mode noise of the input signal may be achieved. Moreover, a high-accuracy, high-speed A/D converter may be achieved without using devices, such as PIP capacitors or MIM capacitors, that employ special fabrication steps in order to achieve high accuracy in the related art. That is, since special masks or process steps are not used for the fabrication of the capacitive elements, the manufacturing cost may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An A/D converter comprising:
a capacitive DAC, including a positive-side capacitive DAC and a negative-side capacitive DAC operating in a complementary fashion, configured to perform conversion of high-order bits by receiving a differential signal;
a resistive DAC configured to perform conversion of low-order bits;
a resistive correction DAC configured to operate to correct the capacitive DAC; and
a comparator, including a plurality of differential circuits, configured to compare output potentials of the positive-side capacitive DAC and the negative-side capacitive DAC, and wherein
the positive-side capacitive DAC and the negative-side capacitive DAC include first capacitive elements each formed from interconnect layers excluding an uppermost interconnect layer, and
the comparator includes second capacitive elements each provided between adjacent ones of the differential circuits and formed from interconnect layers including the uppermost interconnect layer.

2. The A/D converter as claimed in claim 1, wherein
the resistive DAC includes a positive-side resistive DAC provided at an output node of the positive-side capacitive DAC and a negative-side resistive DAC provided at an output node of the negative-side capacitive DAC, and
the resistive correction DAC includes a positive-side resistive correction DAC configured to correct an error in the positive-side capacitive DAC, and a negative-side resistive correction DAC configured to correct an error in the negative-side capacitive DAC.

3. The A/D converter as claimed in claim 1, wherein
the first capacitive elements each have a top electrode connected to the output node of the positive-side or negative-side capacitive DAC, and a bottom electrode connected to one or the other of analog input nodes that is selected between a reference potential and the differential signal.

4. The A/D converter as claimed in claim 3, wherein
the first capacitive elements each have a cross section such that the top electrode is sandwiched by the bottom electrode when viewed in a thickness direction of a semiconductor substrate on which the A/D converter is fabricated.

5. The A/D converter as claimed in claim 4, wherein
the first capacitive elements each have a structure such that the bottom electrode is arranged around the top electrode when viewed in a direction parallel to a surface of the semiconductor substrate.

6. The A/D converter as claimed in claim 5, wherein
a connection fixed to a constant potential is arranged around the bottom plate when viewed in the direction parallel to the surface of the semiconductor substrate.

7. The A/D converter as claimed in claim 1, wherein
the second capacitive elements each have a first electrode connected to an output node of a preceding-stage differential circuit in an array of the plurality of differential circuits, and a second electrode connected to an input node of a succeeding-stage differential circuit which receives an output from the preceding-stage differential circuit.

8. The A/D converter as claimed in claim 7, wherein
the preceding-stage differential circuit is a first-stage differential circuit in the array of the plurality of differential circuits, and the succeeding-stage differential circuit is a second-stage differential circuit in the array of the plurality of differential circuits.

9. The A/D converter as claimed in claim 8, wherein
the second capacitive elements each have a cross section such that the second electrode is sandwiched by the first electrode when viewed in a thickness direction of a semiconductor substrate on which the A/D converter is fabricated.

10. The A/D converter as claimed in claim 9, wherein
the second capacitive elements each have a structure such that the first electrode is arranged around the second electrode when viewed in a direction parallel to a surface of the semiconductor substrate.

11. The A/D converter as claimed in claim 8, wherein
the comparator further includes third capacitive elements each provided between adjacent ones of the plurality of differential circuits excluding the first-stage and second-stage differential circuits, and
the third capacitive elements are each constructed from a poly-diffusion capacitor.

12. The A/D converter as claimed in claim 1, wherein
the comparator includes an amplitude limiting device provided between output nodes of at least the first-stage differential circuit in the array of the plurality of differential circuits.

13. The A/D converter as claimed in claim 12, wherein
the amplitude limiting device comprises a diode-connected first nMOS transistor and a second nMOS transistor diode-connected in reverse polarity relationship to the first nMOS transistor between the output nodes of the first-stage differential circuit.

14. The A/D converter as claimed in claim 1, wherein
the differential circuits forming the comparator each comprise:
a first pMOS transistor whose source is connected to a high-potential power supply line;
second and third pMOS transistors whose sources are connected to a drain of the first pMOS transistor;
a first load device connected between a low-potential power supply line and a drain of the second pMOS transistor; and
a second load device connected between the low-potential power supply line and a drain of the third pMOS transistor, and wherein
the drain of each of the second and third pMOS transistors provides an output of the differential circuit.

15. The A/D converter as claimed in claim 1, wherein
in the array of the plurality of differential circuits in the comparator, each differential circuit supplies a larger bias current than its succeeding differential circuit.

* * * * *